(12) United States Patent
Tsugawa et al.

(10) Patent No.: US 12,376,400 B2
(45) Date of Patent: Jul. 29, 2025

(54) IMAGING DEVICE

(71) Applicant: SONY SEMICONDUCTOR SOLUTIONS CORPORATION, Kanagawa (JP)

(72) Inventors: Hidenobu Tsugawa, Kanagawa (JP); Ryoichi Nakamura, Kanagawa (JP); Kiichi Ishikawa, Kanagawa (JP); Hiroshi Takahashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 888 days.

(21) Appl. No.: 17/053,888

(22) PCT Filed: Apr. 19, 2019

(86) PCT No.: PCT/JP2019/016759
§ 371 (c)(1),
(2) Date: Nov. 9, 2020

(87) PCT Pub. No.: WO2019/230243
PCT Pub. Date: Dec. 5, 2019

(65) Prior Publication Data
US 2021/0249458 A1 Aug. 12, 2021

(30) Foreign Application Priority Data
May 28, 2018 (JP) ................................. 2018-101579

(51) Int. Cl.
*H10F 39/00* (2025.01)
*H10F 39/12* (2025.01)

(52) U.S. Cl.
CPC ......... *H10F 39/806* (2025.01); *H10F 39/024* (2025.01); *H10F 39/199* (2025.01); *H10F 39/8053* (2025.01)

(58) Field of Classification Search
None
See application file for complete search history.

(56) References Cited

U.S. PATENT DOCUMENTS

| 8,957,358 B2 | 2/2015 | Wan et al. |
| 9,136,293 B2 | 9/2015 | Yee et al. |

(Continued)

FOREIGN PATENT DOCUMENTS

| CN | 1606808 A | 4/2005 |
| CN | 102683359 A | 9/2012 |

(Continued)

OTHER PUBLICATIONS

International Search Report and Written Opinion prepared by the Japanese Patent Office on Jul. 4, 2019, for International Application No. PCT/JP2019/016759.

*Primary Examiner* — Nilufa Rahim
(74) *Attorney, Agent, or Firm* — Sheridan Ross PC

(57) ABSTRACT

An imaging device according to an embodiment of the present disclosure including a first chip; a support substrate; and a second chip. The support substrate includes an excavated portion in a region opposed to the first chip. The excavated portion has a shape of a recess or a shape of a hole. The second chip is disposed in the excavated portion of the support substrate. The second chip is electrically coupled to the first chip. At least one of the first chip or the second chip has a photoelectric conversion function.

20 Claims, 34 Drawing Sheets

(56) References Cited

U.S. PATENT DOCUMENTS

| | | |
|---|---|---|
| 9,136,302 B2 | 9/2015 | Wang et al. |
| 2003/0218120 A1 | 11/2003 | Shibayama |
| 2005/0001331 A1 | 1/2005 | Kojima et al. |
| 2008/0308928 A1 | 12/2008 | Chang et al. |
| 2009/0262226 A1* | 10/2009 | Lee ................ H01L 25/043 348/340 |
| 2010/0019338 A1* | 1/2010 | Kwon ............. H01L 25/0657 257/E31.11 |
| 2013/0181314 A1* | 7/2013 | Ryu ................ H10F 39/8057 257/E31.127 |
| 2013/0285180 A1 | 10/2013 | Wang et al. |
| 2014/0070348 A1 | 3/2014 | Yee et al. |
| 2014/0306294 A1 | 10/2014 | Chen |
| 2016/0013235 A1 | 1/2016 | Yee et al. |
| 2016/0163751 A1* | 6/2016 | Sugiyama ............ H01L 24/32 257/432 |
| 2016/0338202 A1 | 11/2016 | Park et al. |
| 2017/0040265 A1 | 2/2017 | Park et al. |
| 2017/0345861 A1* | 11/2017 | Yang .............. H01L 27/14618 |
| 2018/0053732 A1 | 2/2018 | Baek |
| 2018/0130750 A1 | 5/2018 | Jung et al. |
| 2018/0130846 A1* | 5/2018 | Hasegawa ......... H01L 27/14618 |
| 2018/0145044 A1 | 5/2018 | Park et al. |
| 2018/0175092 A1* | 6/2018 | Yiu .................. H01L 27/14627 |
| 2018/0226351 A1 | 8/2018 | Park et al. |
| 2019/0057952 A1* | 2/2019 | Chen ................ H01L 24/29 |
| 2019/0267416 A1* | 8/2019 | Kohama ........... H01L 27/14618 |
| 2021/0013256 A1* | 1/2021 | Lin .................. H01L 27/14634 |

FOREIGN PATENT DOCUMENTS

| | | |
|---|---|---|
| CN | 103311257 A | 9/2013 |
| CN | 103378109 A | 10/2013 |
| CN | 104882456 A | 9/2015 |
| CN | 106847796 A | 6/2017 |
| JP | 2002-064177 | 2/2002 |
| JP | 2003-264280 | 9/2003 |
| JP | 2005-039227 | 2/2005 |
| JP | 2005242242 A | 9/2005 |
| JP | 2013-232647 | 11/2013 |
| JP | 2016-213466 | 12/2016 |
| JP | 2018-078274 | 5/2018 |
| WO | WO-2009096240 A1 | 8/2009 |

\* cited by examiner

IMAGING DEVICE

CROSS REFERENCE TO RELATED APPLICATIONS

This application is a national stage application under 35 U.S.C. 371 and claims the benefit of PCT Application No. PCT/JP2019/016759 having an international filing date of 19 Apr. 2019, which designated the United States, which PCT application claimed the benefit of Japanese Patent Application No. 2018-101579 filed 28 May 2018, the entire disclosures of each of which are incorporated herein by reference.

TECHNICAL FIELD

The present disclosure relates to an imaging device including a plurality of chips.

BACKGROUND ART

Stacked imaging devices have been developed that each have a plurality of chips stacked (see, for example, PTL 1). In this imaging device, a chip provided with a photoelectric converter for each pixel and a chip provided with a circuit that processes a signal obtained by each pixel are stacked. These chips are electrically coupled to each other by using, for example, a bump or the like.

CITATION LIST

Patent Literature

PTL 1: Japanese Unexamined Patent Application Publication No. 2016-171297

SUMMARY OF THE INVENTION

Such a stacked imaging device is required to more simplify the electrical coupling between chips disposed in the stacking direction.

It is thus desirable to provide an imaging device that makes it possible to more simplify the electrical coupling between chips disposed in the stacking direction.

An imaging device according to an embodiment of the present disclosure includes: a first chip; a support substrate; and a second chip. The support substrate includes an excavated portion in a region opposed to the first chip. The excavated portion has a shape of a recess or a shape of a hole. The second chip is disposed in the excavated portion of the support substrate. The second chip is electrically coupled to the first chip. At least one of the first chip or the second chip has a photoelectric conversion function.

In the imaging device according to the embodiment of the present disclosure, the second chip is disposed in the excavated portion of the support substrate. This decreases the level difference between the front surface of the second chip and the front surface of the support substrate outside the excavated portion as compared with a case where the second chip is disposed on a support substrate including no excavated portion. That is, it is easier to form a planarized surface on the front surface side of the support substrate provided with the second chip.

The imaging device according to the embodiment of the present disclosure has the second chip disposed in the excavated portion of the support substrate. This makes it possible to easily form a planarized surface on the front surface side of the support substrate provided with the second chip. The first chip is coupled to the second chip with this planarized surface interposed therebetween. This makes it possible to more simplify the electrical coupling between the chips (first chip and second chip) disposed in the stacking direction.

It is to be noted that the above-described contents are an example of the present disclosure. The effects of the present disclosure are not limited to those described above, but may be other different effects or may further include other effects.

Figure 26:
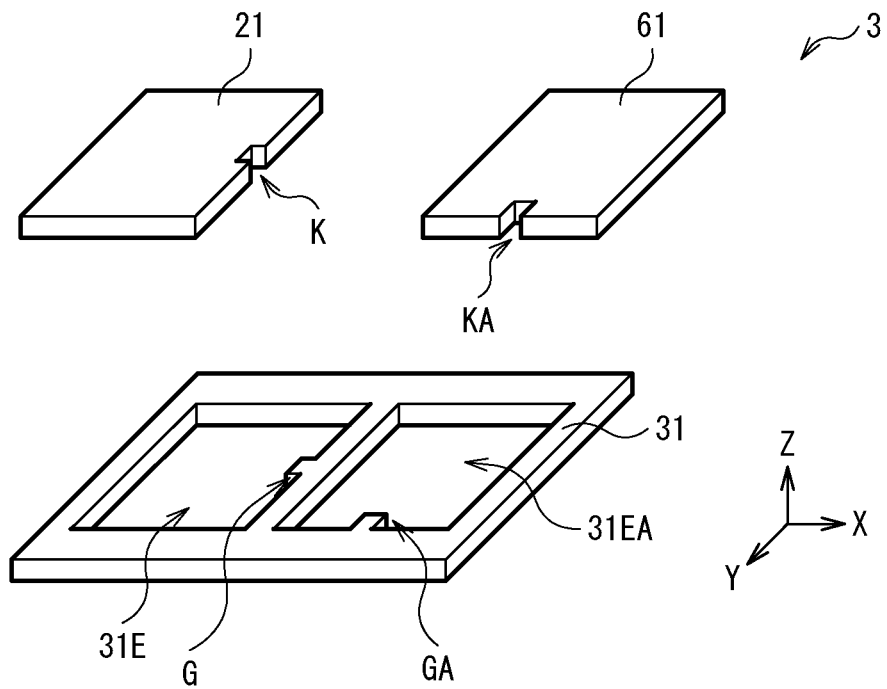
FIG. 26 is an exploded perspective view illustrating a configuration of a main unit of an imaging device according to a third embodiment of the present disclosure.
Figure 27:
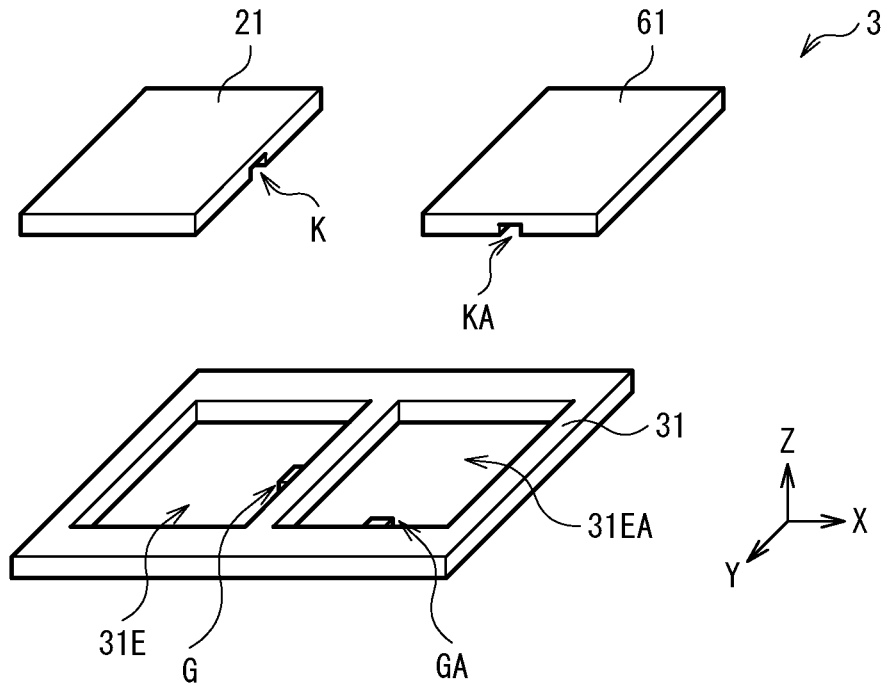
FIG. 27 is an exploded perspective view illustrating another example of a configuration of the imaging device illustrated in FIG. 26.
Figure 28:
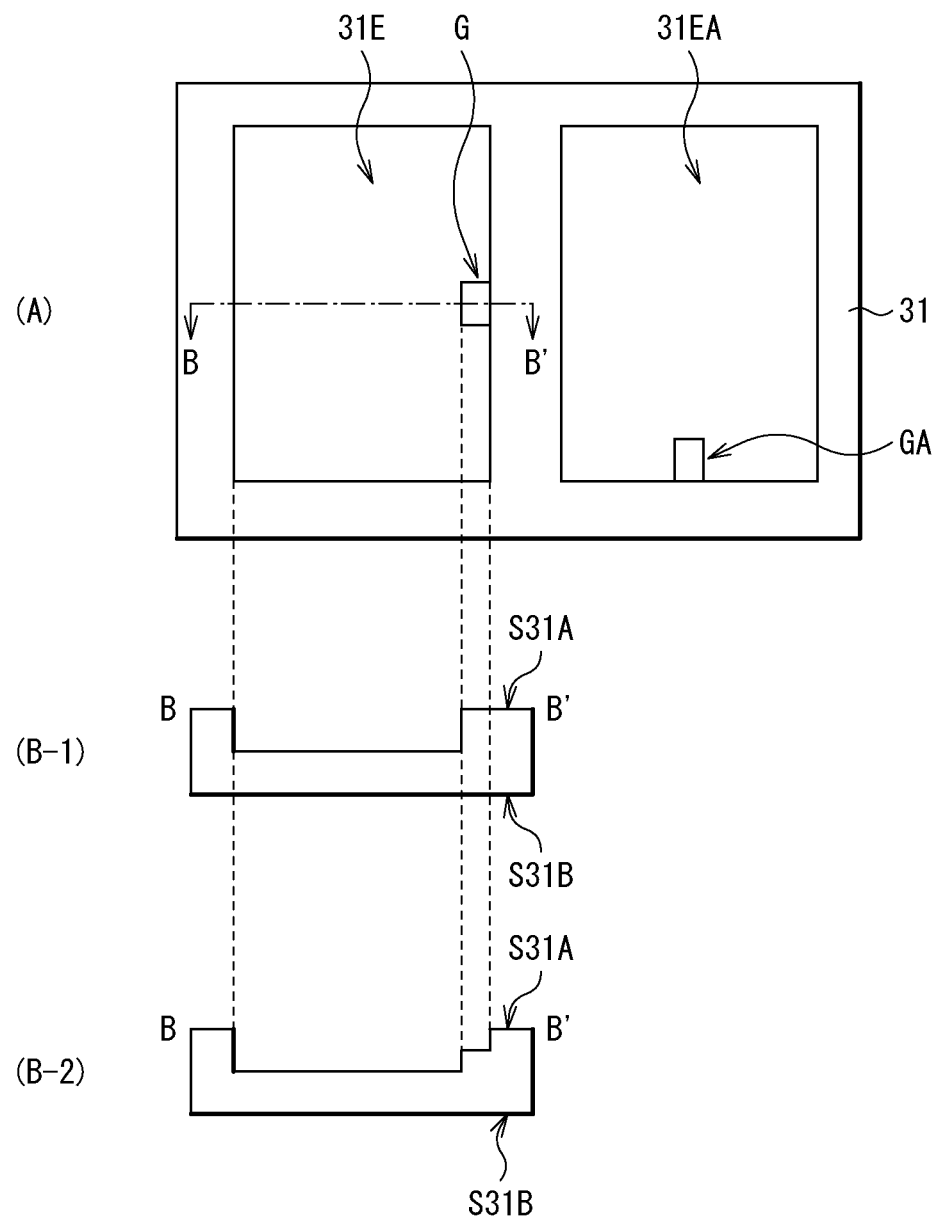

(A) of FIG. 28 is a schematic diagram illustrating a planar configuration of a support substrate illustrated in FIGS. 26 and 27 and (B-1) and (B-2) of FIG. 28 are schematic diagrams each illustrating a cross-sectional configuration taken along a B-B' line illustrated in (A).

Figure 29:
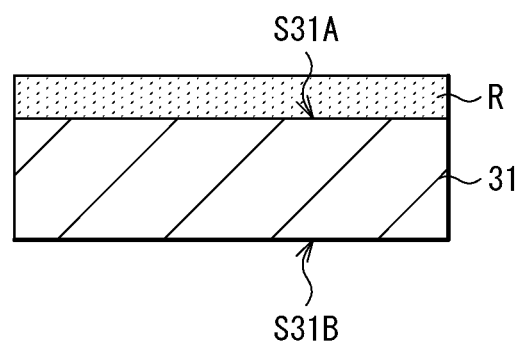

FIG. 29 is a cross-sectional schematic diagram illustrating a step of a method of manufacturing a support substrate illustrated in FIG. 26.

Figure 30:
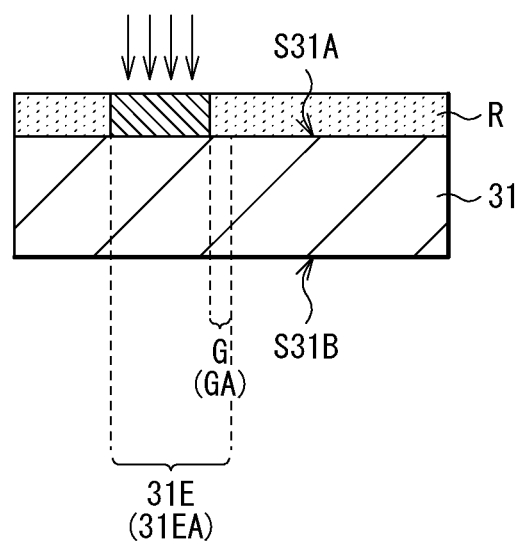

FIG. 30 is a cross-sectional schematic diagram illustrating a step subsequent to FIG. 29.

Figure 31:

FIG. 31 is a perspective view illustrating a step of a method of manufacturing a logic chip illustrated in FIG. 26.

Figure 32:
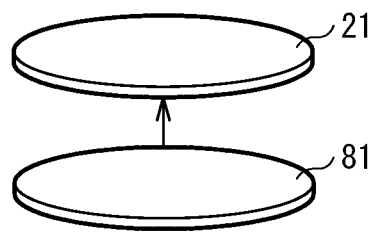

FIG. 32 is a perspective view illustrating a step subsequent to FIG. 31.

Figure 33:
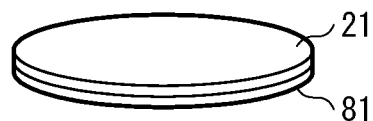

FIG. 33 is a perspective view illustrating a step subsequent to FIG. 32.

Figure 34:
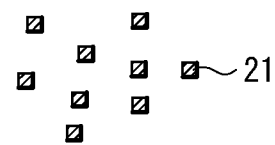

FIG. 34 is a schematic diagram illustrating a step subsequent to FIG. 33.

Figure 35:
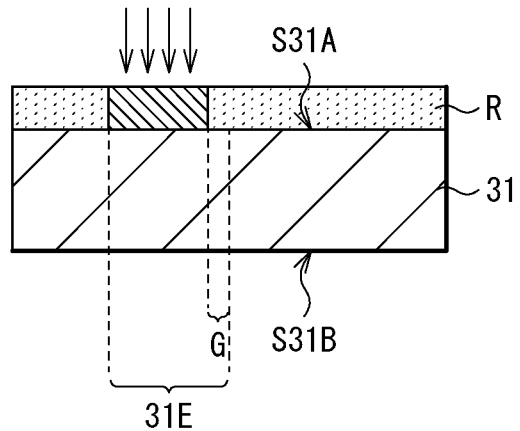

FIG. 35 is a cross-sectional schematic diagram illustrating a step of a method of manufacturing a support substrate illustrated in FIG. 27.

Figure 36:
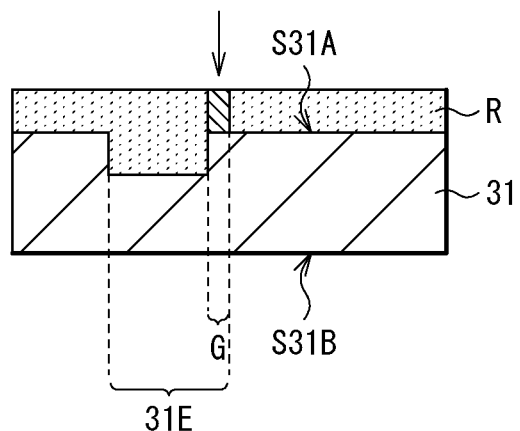

FIG. 36 is a cross-sectional schematic diagram illustrating a step subsequent to FIG. 35.

Figure 37:
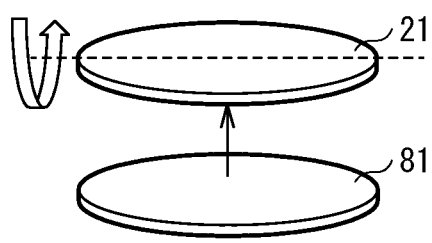

FIG. 37 is a perspective view illustrating a step of a method of manufacturing a logic chip illustrated in FIG. 27.

Figure 38:
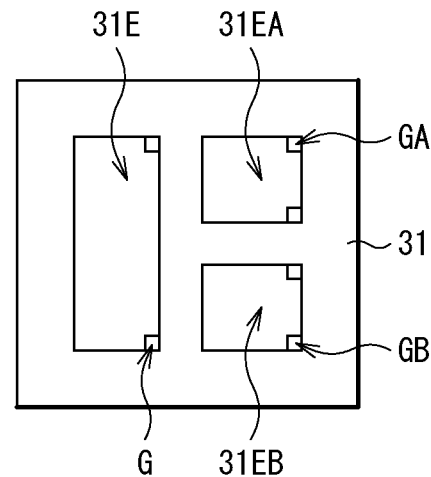

FIG. 38 is a planar schematic diagram illustrating another example (1) of a configuration of the support substrate illustrated in each of FIGS. 26 and 27.

Figure 39:
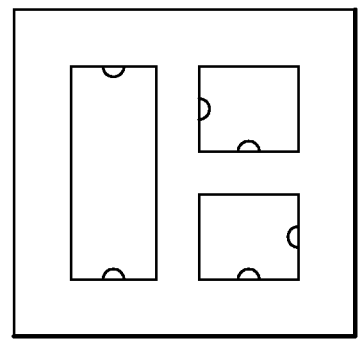

FIG. 39 is a planar schematic diagram illustrating another example (2) of the configuration of the support substrate illustrated in each of FIGS. 26 and 27.

Figure 40:
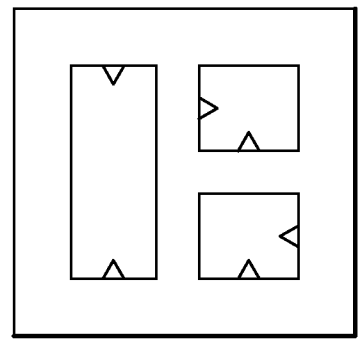

FIG. 40 is a planar schematic diagram illustrating another example (3) of the configuration of the support substrate illustrated in each of FIGS. 26 and 27.

Figure 41:
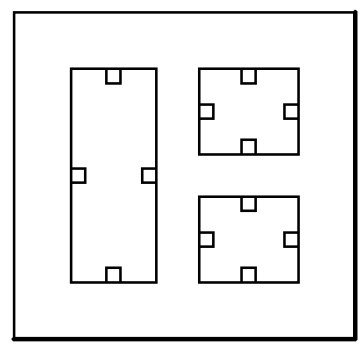

FIG. 41 is a planar schematic diagram illustrating another example (4) of the configuration of the support substrate illustrated in each of FIGS. 26 and 27.

Figure 42:
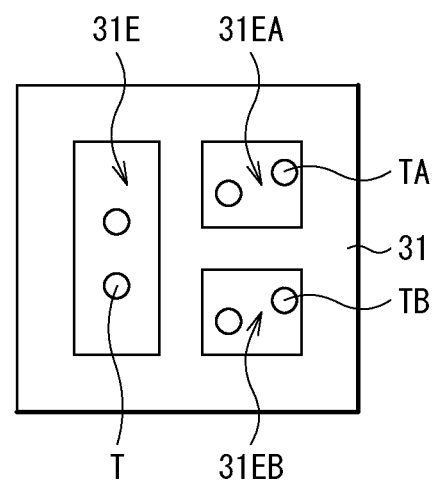

FIG. 42 is a planar schematic diagram illustrating another example (5) of the configuration of the support substrate illustrated in each of FIGS. 26 and 27.

Figure 1:
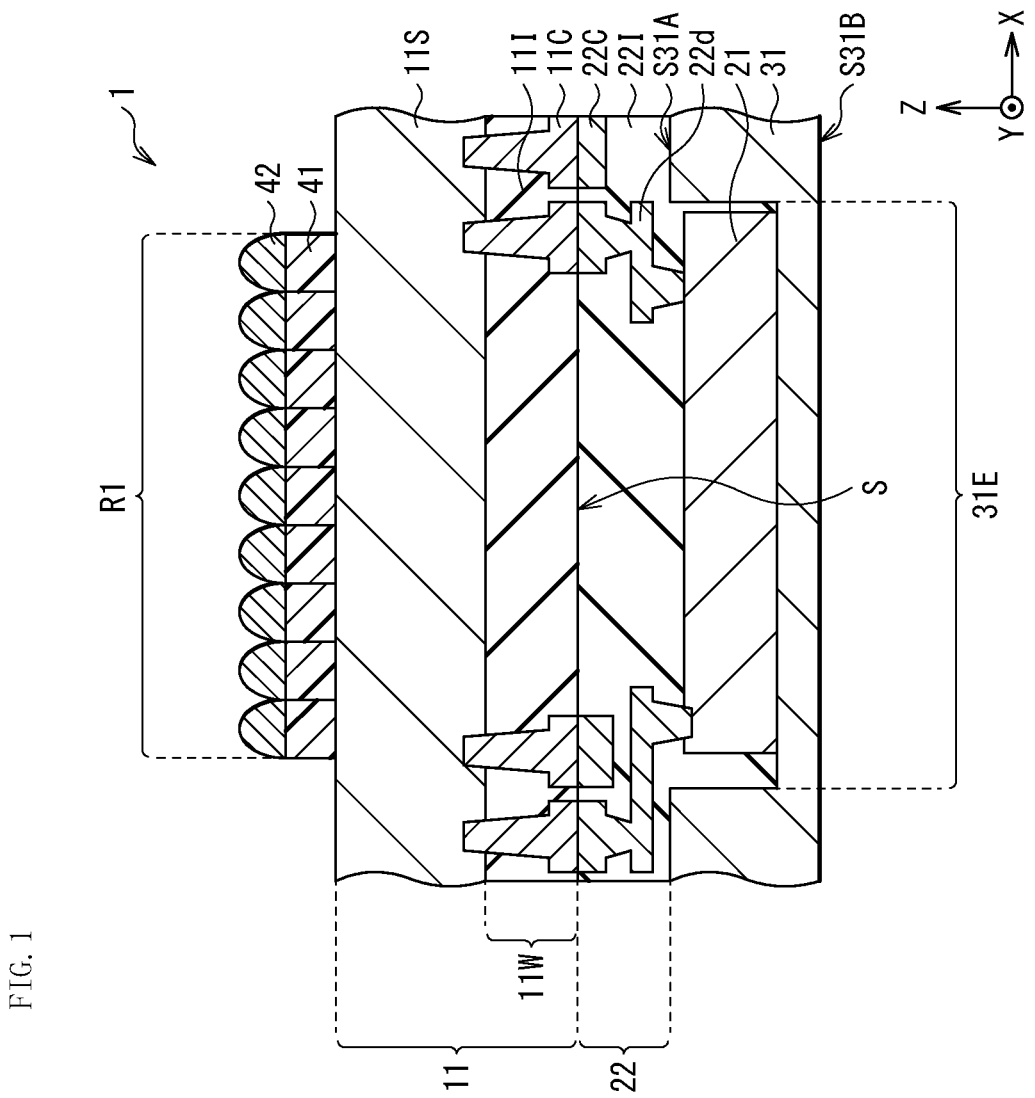
FIG. 1 is a cross-sectional schematic diagram illustrating a configuration of a main unit of an imaging device according to a first embodiment of the present disclosure.
Figure 43:
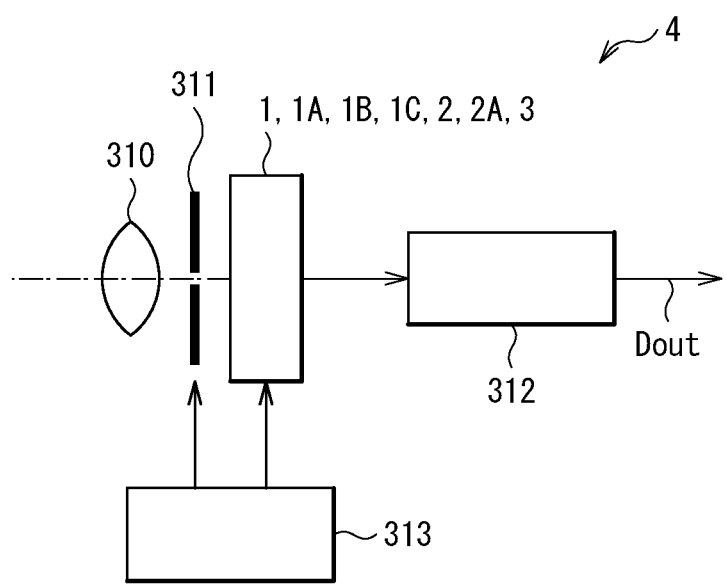

FIG. 43 is a functional block diagram illustrating an example of an electronic apparatus including the imaging device illustrated in FIG. 1 or the like.

Figure 44:
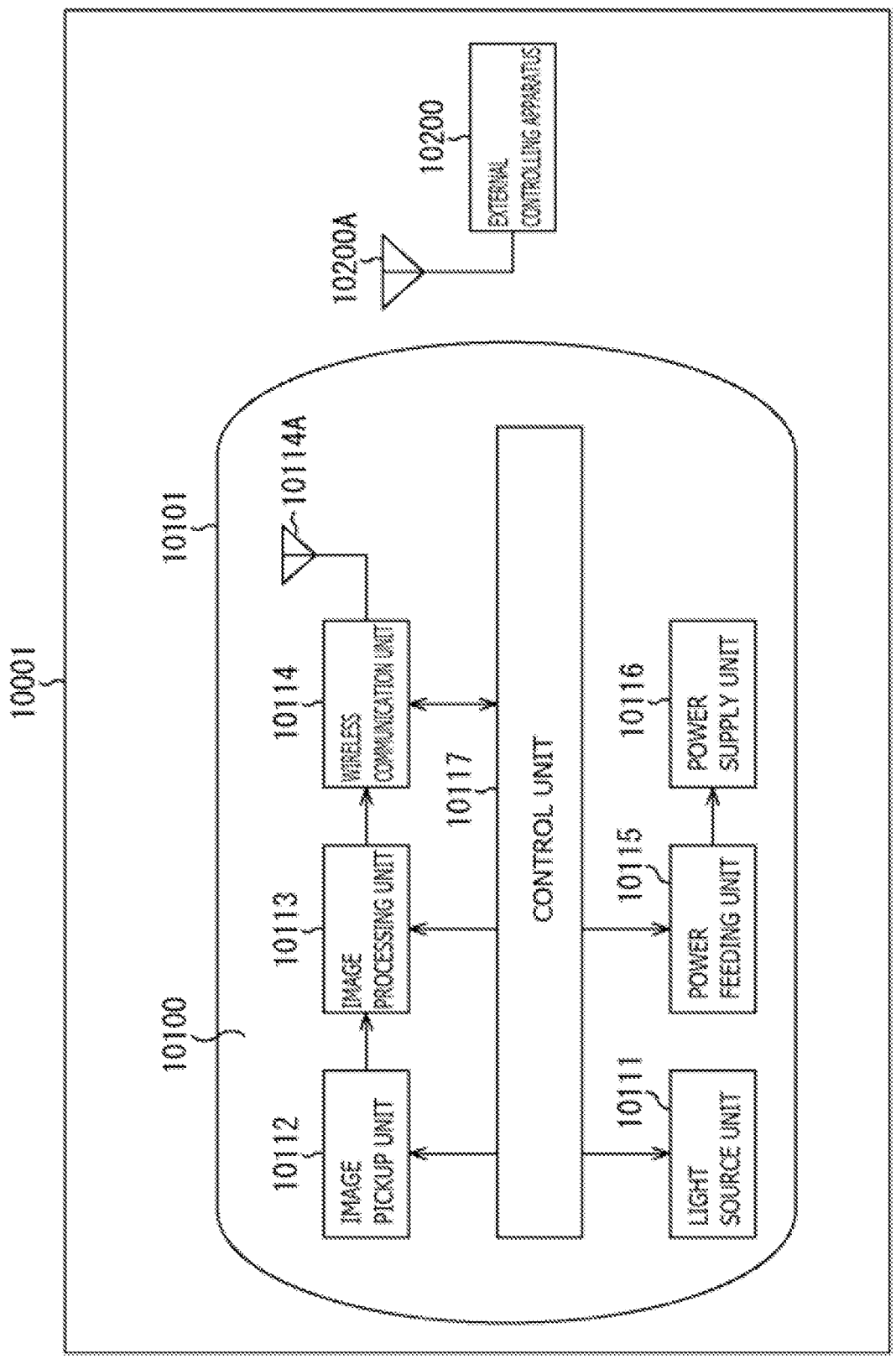

FIG. 44 is a block diagram depicting an example of a schematic configuration of an in-vivo information acquisition system.

Figure 45:
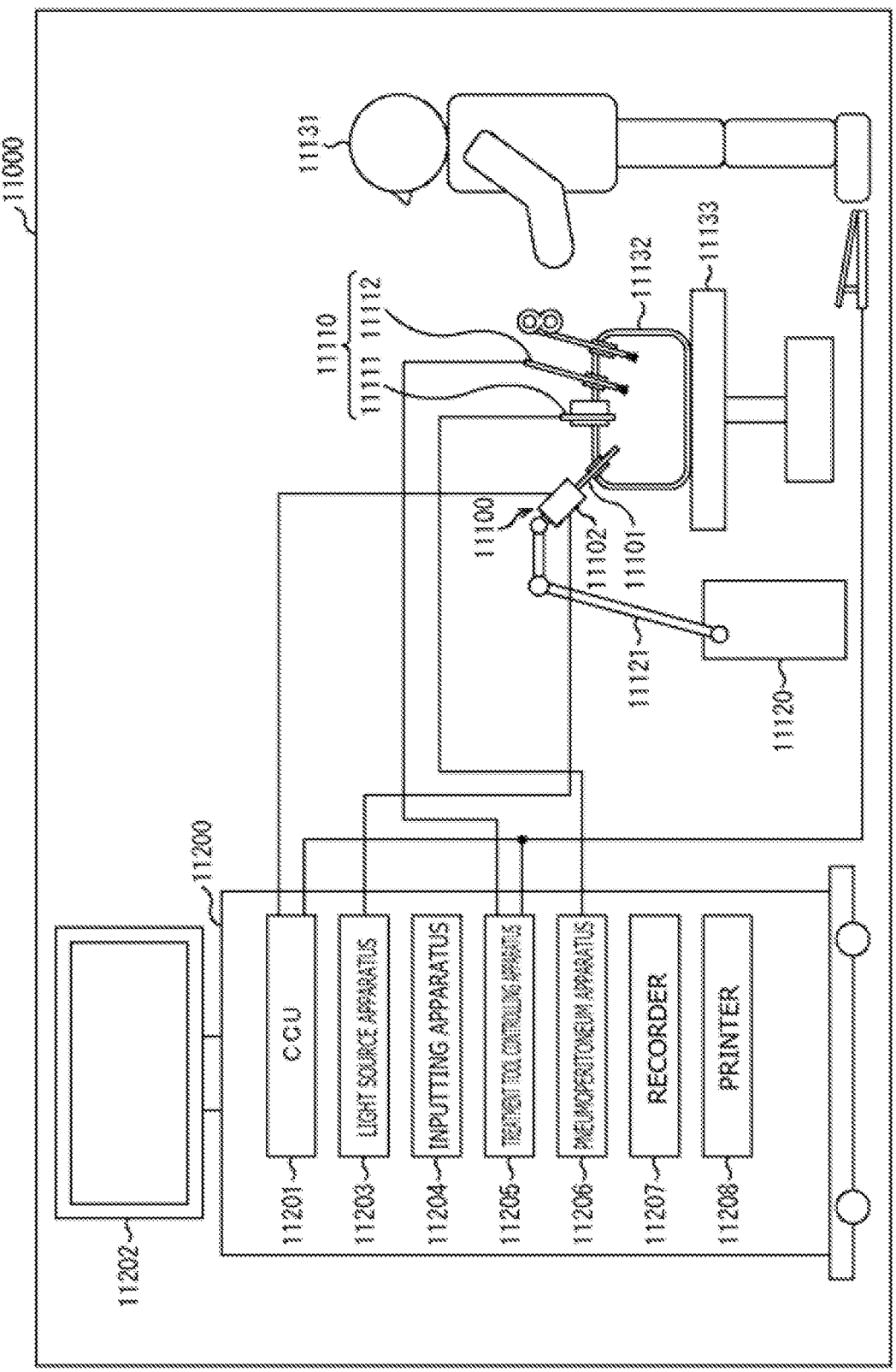

FIG. 45 is a view depicting an example of a schematic configuration of an endoscopic surgery system.

Figure 46:
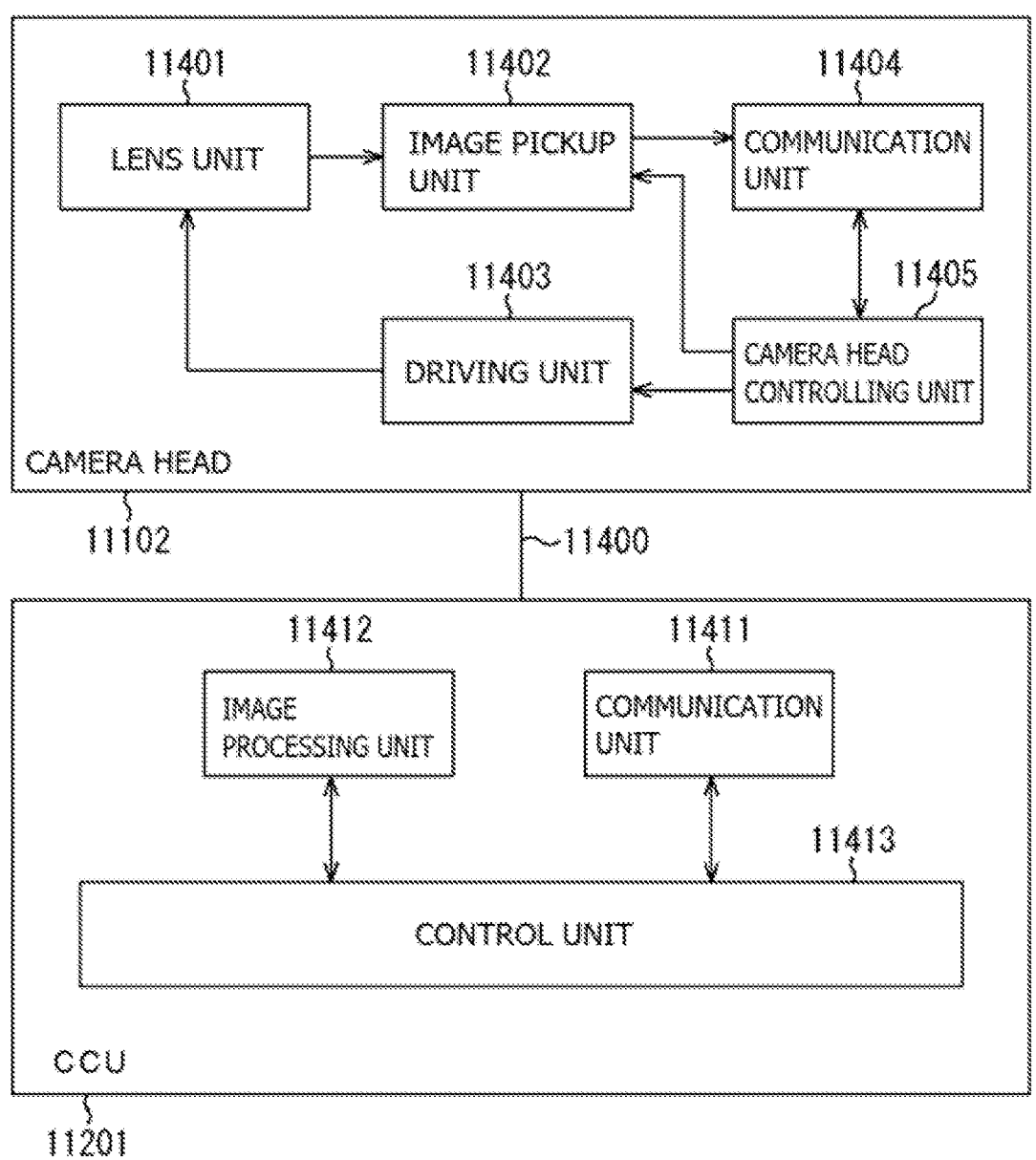

FIG. 46 is a block diagram depicting an example of a functional configuration of a camera head and a camera control unit (CCU).

Figure 47:
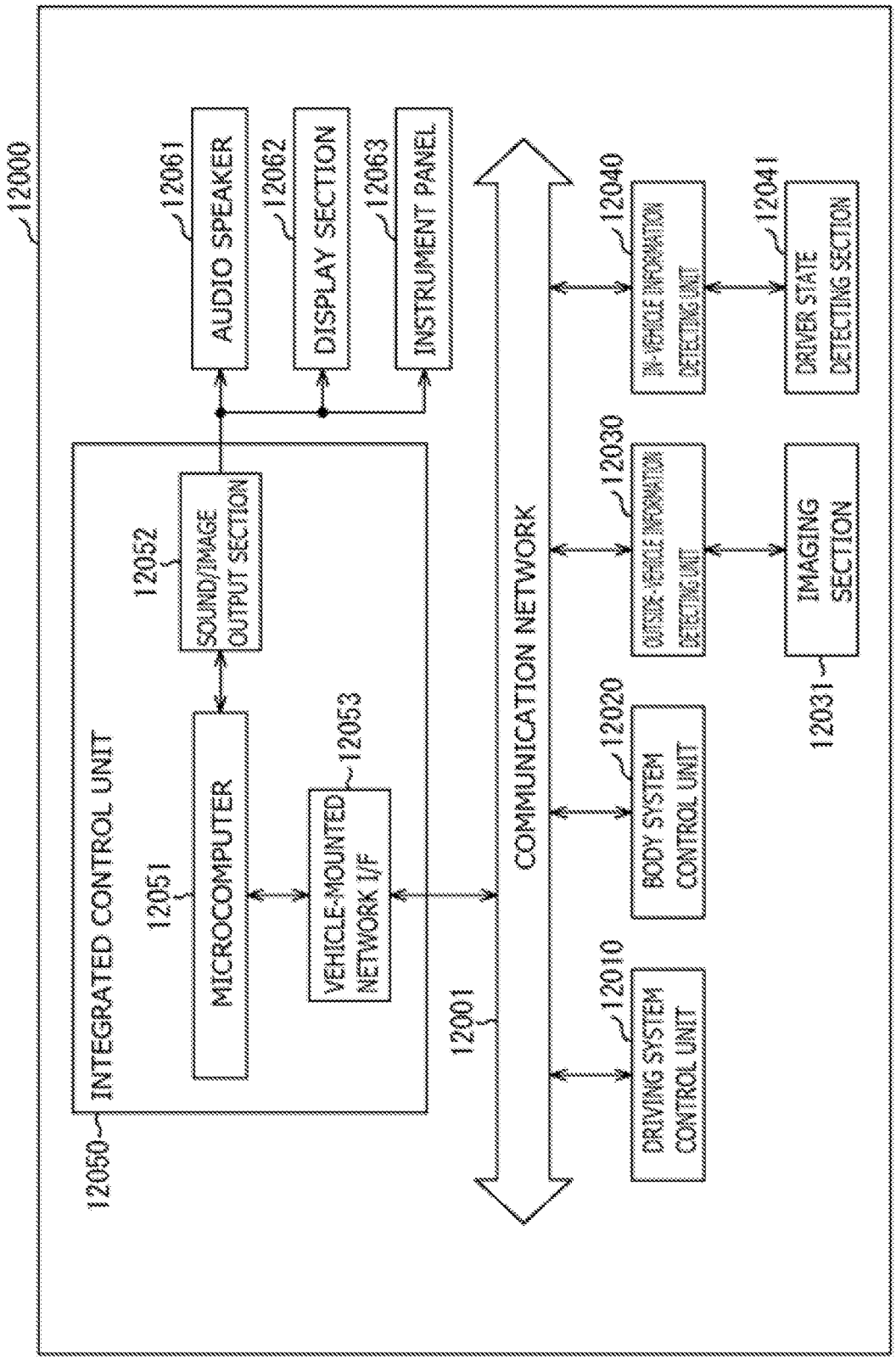

FIG. 47 is a block diagram depicting an example of schematic configuration of a vehicle control system.

Figure 48:
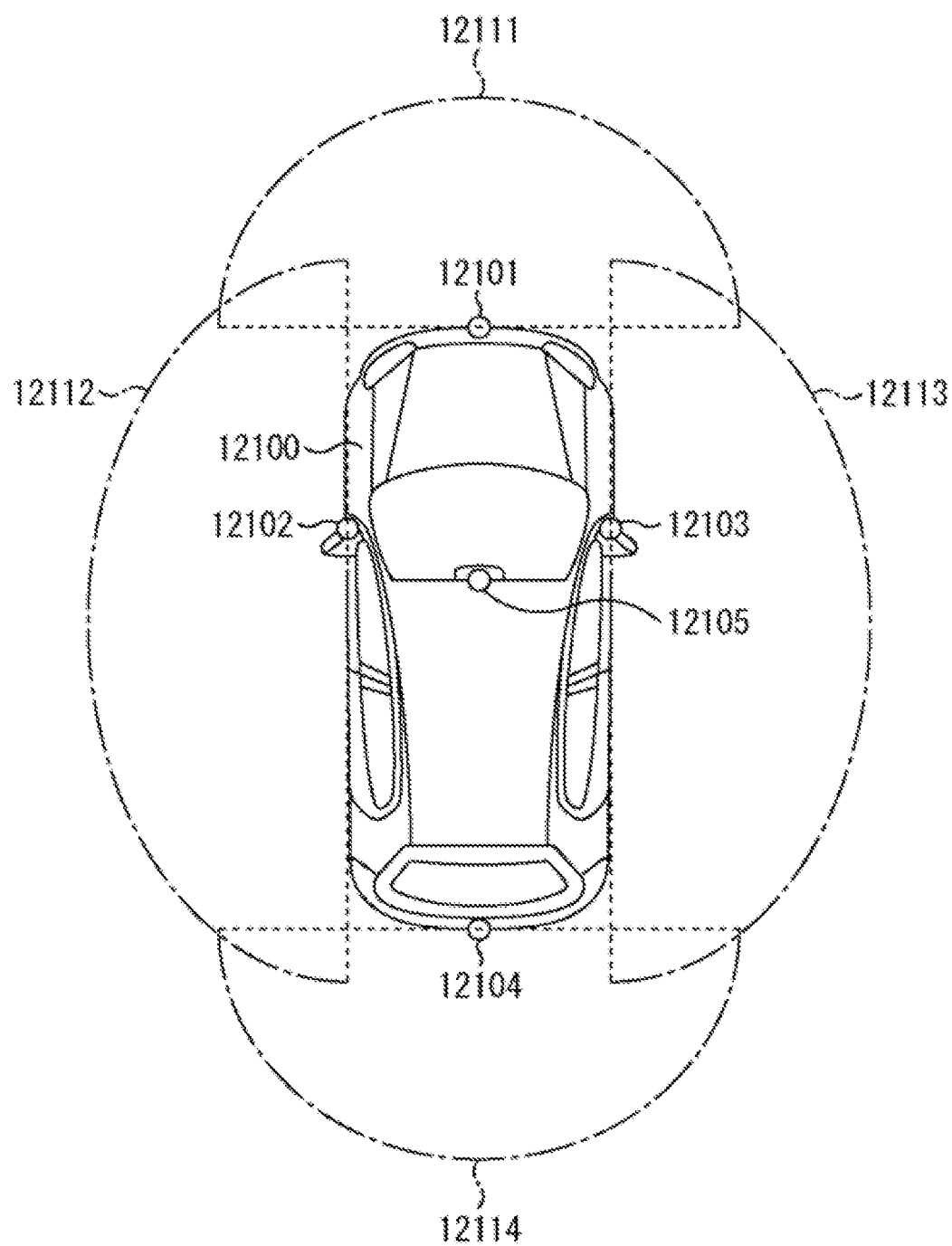

FIG. 48 is a diagram of assistance in explaining an example of installation positions of an outside-vehicle information detecting section and an imaging section.

MODES FOR CARRYING OUT THE INVENTION

The following describes embodiments of the present disclosure in detail with reference to the drawings. It is to be noted that description is given in the following order.
1. First Embodiment (imaging device whose support substrate includes excavated portion)
2. Modification Example 1 (example in which sensor chip is disposed in excavated portion)
3. Modification Example 2 (example in which CSP (Chip Size Package) structure is included)
4. Modification Example 3 (example in which stacked structure of three or more chips is included)
5. Second Embodiment (imaging device whose support substrate includes plurality of excavated portions)
6. Modification Example 4 (example in which CSP structure is included)
7. Third Embodiment (imaging device provided with position determiner at excavated portion)
8. Modification Example 5 (example of planar configuration of projecting portion)
9. Modification Example 6 (example in which position determiner other than projecting portion is included)
10. Applied Examples (Electronic Apparatuses)
11. Application Examples First Embodiment (Configuration of Imaging Device 1)

FIG. 1 schematically illustrates an example of a cross-sectional configuration of a solid-state imaging device (imaging device 1) according to a first embodiment of the present disclosure. This imaging device 1 is, for example, a back-illuminated CMOS (complementary Metal Oxide Semiconductor) image sensor. The imaging device 1 has a stacked structure of a sensor chip 11 (first chip) and a logic chip 21 (second chip). The sensor chip 11 includes a semiconductor substrate 11S and a multilayer wiring layer 11W. There is provided a wiring layer 22 (first wiring layer) between the multilayer wiring layer 11W of the sensor chip 11 and the logic chip 21. The imaging device 1 has a junction surface S between the wiring layer 22 and the multilayer wiring layer 11W. The logic chip 21 is supported by a support substrate 31. The sensor chip 11 is provided with a color filter 41 and an on-chip lens 42 on the light receiving surface.

Figure 2:
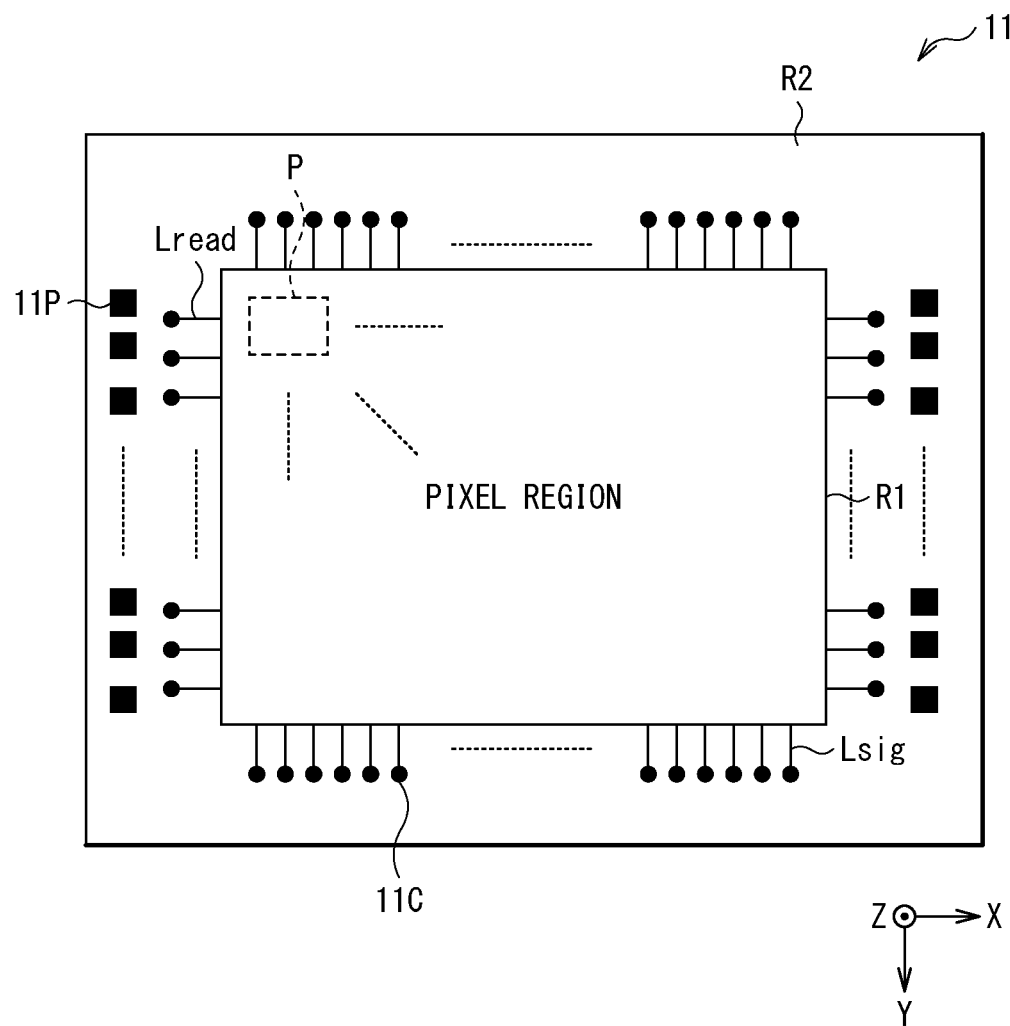
FIG. 2 is a schematic diagram illustrating an example of a planar configuration of a sensor chip illustrated in FIG. 1.

FIG. 2 schematically illustrates a planar configuration of the sensor chip 11. The sensor chip 11 has, for example, a quadrangular planar shape. This sensor chip 11 has, for example, a quadrangular pixel region R1 at the central portion. A peripheral region R2 is provided outside the pixel region R1 to surround the pixel region R1. The pixel region R1 is provided with a plurality of light receiving unit regions (pixels P) that is two-dimensionally disposed, for example.

In the pixel region R1, a pixel drive line Lread is disposed for each pixel row of the matrix pixel arrangement along the row direction (arrangement direction of the pixels in the pixel row). A vertical signal line Lsig is disposed for each pixel column along the column direction (arrangement direction of the pixels in the pixel column). The pixel drive line Lread is for transmitting driving signals to the respective pixels P. These driving signals are outputted, for example, from the logic chip 21 row by row. The pixel drive line Lread extends from the pixel region R1 to the peripheral region R2 and has an end coupled to a contact electrode 11C. Signals outputted from pixels are supplied, for example, to the logic chip 21 through the respective vertical signal lines Lsig. The vertical signal lines Lsig each extend from the pixel region R1 to the peripheral region R2 and each have an end coupled to the contact electrode 11C. The contact electrode 11C is for electrically coupling the sensor chip 11 to the logic chip 21. For example, the contact electrodes 11C are provided to the peripheral region R2 to surround the pixel region R1. A plurality of pad electrodes 11P is provided outside the contact electrodes 11C. These pad electrodes 11P each function as an external coupling terminal. The pad electrode 11P is for inputting and outputting signals between the imaging device 1 and the outside. FIG. 2 illustrates an example in which the plurality of pad electrodes 11P is arranged on two opposed sides outside the quadrangular pixel region R1, but the pad electrodes 11P may be provided to two adjacent sides. Alternatively, the pad electrodes 11P may be provided to one or three or more sides.

Figure 3:
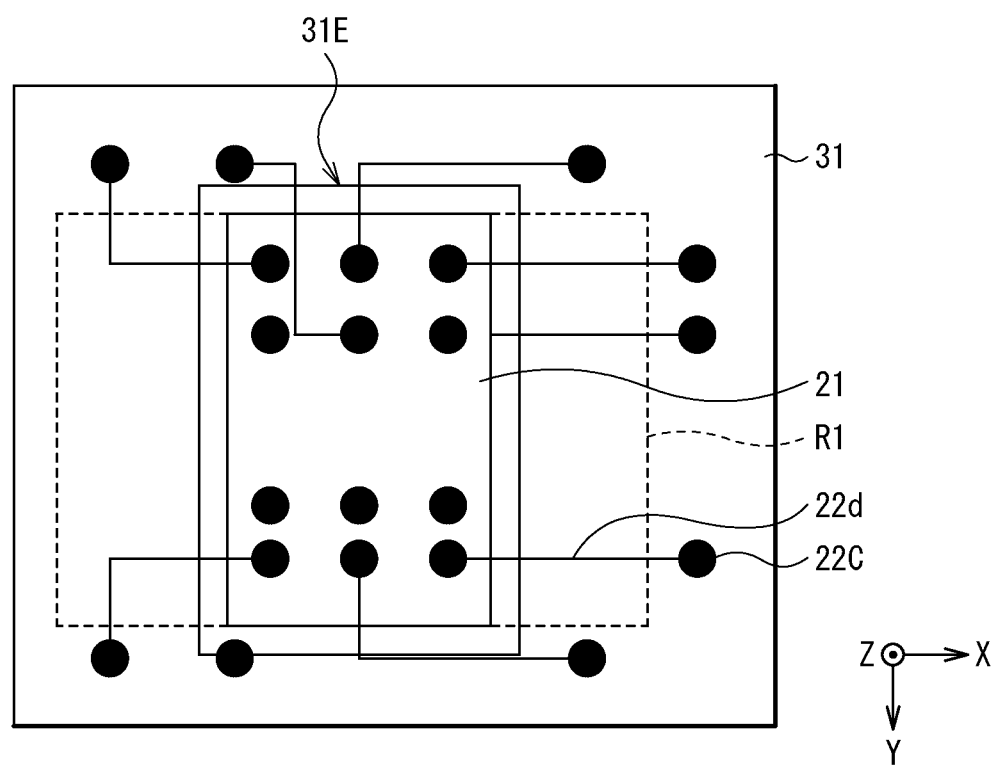
FIG. 3 is a schematic diagram illustrating examples of planar configurations of a wiring layer, a logic chip, and a support substrate illustrated in FIG. 1.

FIG. 3 schematically illustrates planar configurations of the logic chip 21, the wiring layer 22, and the support substrate 31. The logic chip 21 has, for example, a quadrangular planar shape. In a plan (XY plane in FIGS. 1 to 3) view, the logic chip 21 is smaller than the sensor chip 11. The logic chip 21 is disposed, for example, at a position opposed to the pixel region R1 of the sensor chip 11. The logic chip 21 is electrically coupled to the sensor chip 11 via a rewiring layer 22d and a contact electrode 22C provided to the wiring layer 22. The contact electrode 22C is disposed, for example, at a position (outside the logic chip 21) that does not overlap with the logic chip 21 in a plan view.

The following describes specific configurations of the sensor chip 11, the logic chip 21, the wiring layer 22, and the support substrate 31 with reference to FIGS. 1 to 3.

The sensor chip 11 larger than the logic chip 21 in chip size is a chip having a photoelectric conversion function and includes a sensor circuit. The sensor chip 11 includes the multilayer wiring layer 11W and the semiconductor substrate 11S in this order from the wiring layer 22 side (FIG. 1). The semiconductor substrate 11S between the multilayer wiring layer 11W and the color filter 41 is, for example, a silicon (Si) substrate. The semiconductor substrate 11S is provided with PD (Photo Diode) for each pixel P. The multilayer wiring layer 11W between the semiconductor substrate 11S and the wiring layer 22 includes an insulating film 11I and the contact electrode 11C. The insulating film 11I is for separating wiring lines of the multilayer wiring layer 11W and includes, for example, silicon oxide (SiO) or the like. The contact electrode 11C is, for example, for coupling the sensor circuit provided to the semiconductor substrate 11S and the contact electrode 22C. This contact electrode 11C includes, for example, copper (Cu) and has one of the surfaces exposed to the junction surface S. It is to be noted that the multilayer wiring layer 11W includes a plurality of wiring lines (not illustrated in FIG. 1) included in the sensor circuit.

The logic chip 21 provided to be opposed to the sensor chip 11 includes, for example, a logic circuit electrically coupled to the PD of the sensor chip 11. This logic chip 21 includes, for example, a semiconductor substrate and a p-type semiconductor well region of this semiconductor substrate is provided with a plurality of MOS (Metal Oxide Semiconductor) transistors. The logic circuit includes, for example, the plurality of these MOS transistors. The semiconductor substrate includes, for example, a silicon substrate. It is preferable that the logic chip 21 provided on the support substrate 31 include the same material as a material included in the support substrate 31.

The wiring layer 22 provided between the logic chip 21 and the sensor chip 11 (multilayer wiring layer 11W) includes an insulating film 22I, the rewiring layer 22d, and the contact electrode 22C (FIGS. 1 and 3). The insulating film 22I is for separating wiring lines of the wiring layer 22 and includes, for example, silicon oxide (SiO) or the like. The rewiring layer 22d is for coupling the logic circuit of the logic chip 21 and the contact electrode 22C. This rewiring layer 22d is drawn out from a position overlapping with the logic chip 21 in a plan view to the outside (onto the support substrate 31) of the logic chip 21. The rewiring layer 22d includes, for example, an electrically conductive material such as copper (Cu) or aluminum (Al). The contact electrode 22C is for coupling the rewiring layer 22d and the contact electrode 11C. This contact electrode 22C includes, for example, copper (Cu) and has one of the surfaces exposed to the junction surface S. The contact electrode 22C is in contact with the contact electrode 11C on the junction surface S. This coupling between the contact electrodes 11C and 22C is, for example, CuCu junction. That is, the sensor chip 11 is electrically coupled to the logic chip 21, for example, by CuCu junction. The wiring layer 22 has a planarized surface that is formed, for example, through a planarization process such as CMP (Chemical Mechanical Polishing). This planarized surface is included in the junction surface S with the sensor chip 11.

Figure 4:
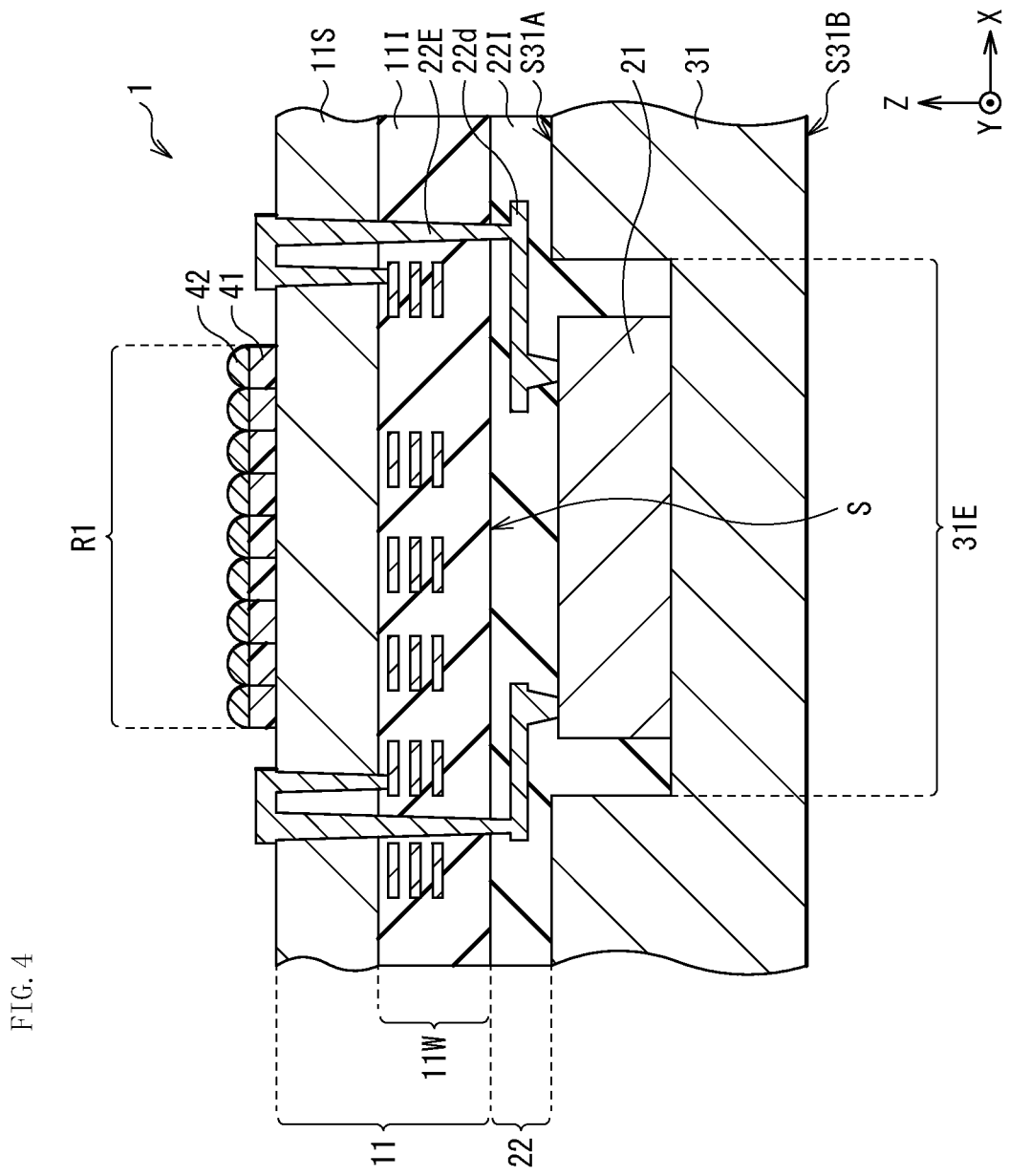
FIG. 4 is a cross-sectional schematic diagram illustrating another example (1) of a configuration of the imaging device illustrated in FIG. 1.

FIG. 4 schematically illustrates a cross-sectional configuration of the imaging device 1 that has the sensor chip 11 and the logic chip 21 coupled by a through electrode (through electrode 22E). The through electrode 22E is, for example, TSV (Through Silicon Via). The through electrode 22E is provided by penetrating the sensor chip 11. This through electrode 22E electrically couples the rewiring layer 22d of the wiring layer 22 and a wiring line of the multilayer wiring layer 11W. In this way, the sensor chip 11 and the logic chip 21 may be electrically coupled in a method other than CuCu junction. For example, it is also possible to omit the contact electrode 22C of the wiring layer 22 and directly couple the rewiring layer 22d of the wiring layer 22 and the contact electrode 11C of the multilayer wiring layer 11W.

The logic chip 21 is supported by the support substrate 31. The support substrate 31 includes, for example, a silicon (Si) substrate or the like. The support substrate 31 has, for example, a quadrangular planar shape. This support substrate 31 is larger than the logic chip 21 in a plan view and has substantially the same size as that of the sensor chip 11. The support substrate 31 has a front surface S31A on the wiring layer 22 side and a back surface S31B opposed to the front surface S31A. In the present embodiment, this support substrate 31 includes an excavated portion 31E in a region opposed to the sensor chip 11 and the logic chip 21 is disposed in this excavated portion 31E. Although described below in detail, this decreases the level difference between the front surface (surface opposed to the sensor chip 11) of the logic chip 21 and the front surface S31A of the support substrate 31. It is thus possible to easily form a planarized surface (junction surface S) in the wiring layer 22 on the front surface S31A side of the support substrate 31.

The excavated portion 31E of the support substrate 31 is a section that is excavated closer to the back surface S31B than the front surface S31A of the support substrate 31 in another section. The excavated portion 31E is obtained, for example, by excavating a recess.

Figure 5:
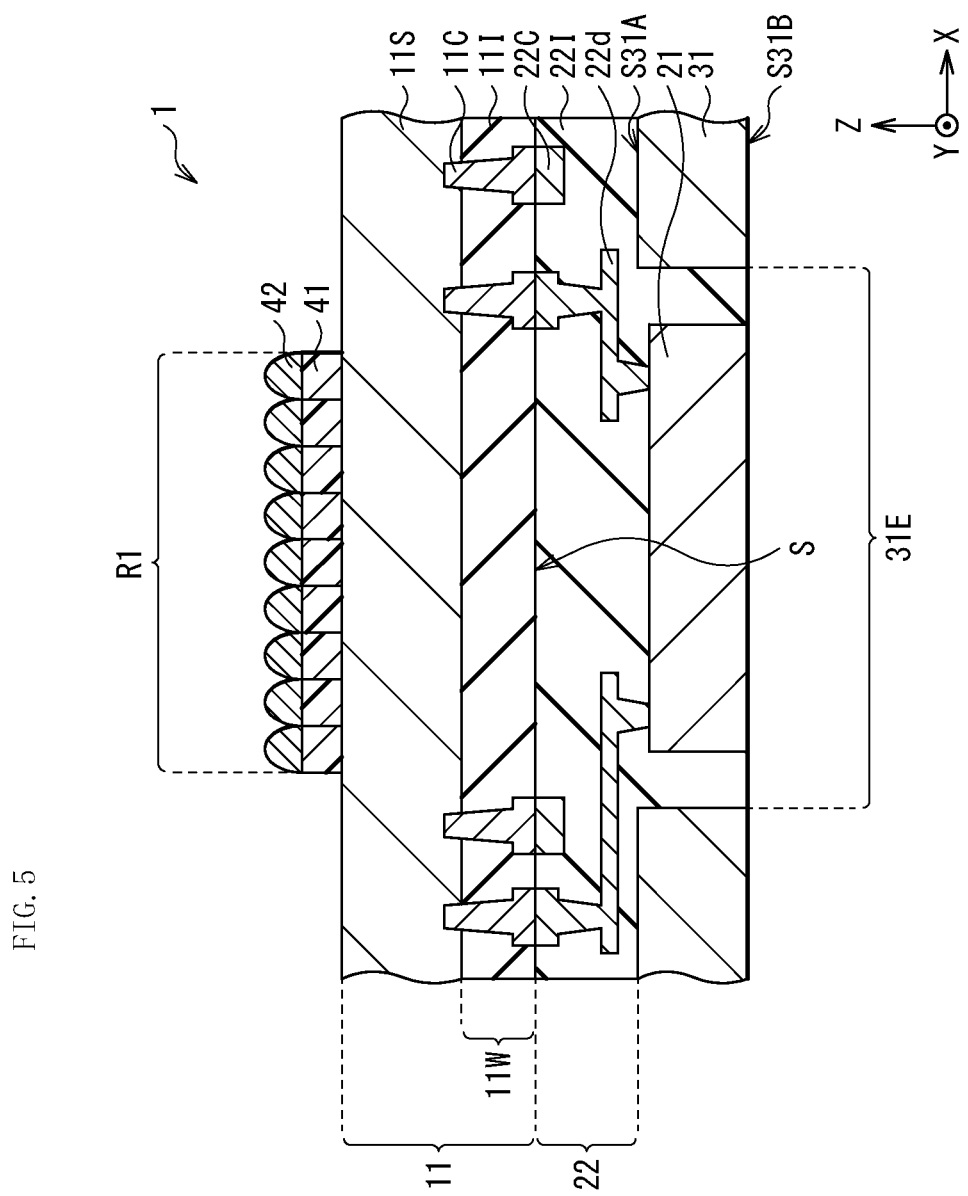
FIG. 5 is a cross-sectional schematic diagram illustrating another example (2) of the configuration of the imaging device illustrated in FIG. 1.

The imaging device 1 illustrated in FIG. 5 includes the support substrate 31 provided with the excavated portion 31E having the shape of a hole. In this way, the excavated portion 31E may penetrate the support substrate 31 from the front surface S31A to the back surface S31B and expose the back surface of the logic chip 21 on the back surface S31B side of the support substrate 31. The back surface of the logic chip 21 is disposed on substantially the same plane as the back surface S31B of the support substrate 31 outside the excavated portion 31E. The excavated portion 31E having the shape of a hole like this is formed, for example, through a back-grinding process performed on the support substrate 31 including the excavated portion 31E having the shape of a recess when the imaging device 1 is manufactured. The support substrate 31 including the excavated portion 31E having the shape of a hole allows the imaging device 1 to be decreased in thickness in the stacking direction (Z direction in FIG. 1).

The excavated portion 31E having the shape of a recess or the shape of a hole like this has, for example, a quadrangular planar shape and is disposed at the central portion of the support substrate 31 (FIG. 3). The excavated portion 31E has substantially the same planar shape as that of the logic chip 21. In a plan view, the size of the excavated portion 31E is substantially the same as the size of the logic chip 21 or greater than the size of the logic chip 21. The size of the excavated portion 31E may be, for example, about several μm greater than the size of the logic chip 21. In a plan view, the size of the excavated portion 31E is less, for example, than the size of the sensor chip 11. The sensor chip 11 has a region opposed to the logic chip 21 (excavated portion 31E) and a region opposed to the support substrate 31 outside the excavated portion 31E. It is preferable that the support substrate 31 have greater thickness than the thickness of the logic chip 21 and the depth (size in the Z direction in FIG. 1) of the excavated portion 31E be substantially the same as the thickness of the logic chip 21. This makes it possible to further decrease the level difference between the front surface of the logic chip 21 and the front surface S31A of the support substrate 31. The depth of the excavated portion 31E may be, for example, about several μm greater than the thickness of the logic chip 21.

The insulating film 22I is provided, for example, from the wiring layer 22 to the excavated portion 31E. This insulating film 22I fills a gap between the wall surface of the excavated portion 31E and the logic chip 21. In addition to the insulating film 22I of the wiring layer 22, the excavated portion 31E may be provided with an insulating film.

The wiring layer 22, the sensor chip 11 (pixel region R1), the color filter 41, and the on-chip lens 42 are provided in this order on the logic chip 21 provided to the excavated portion 31E of the support substrate 31. The color filter 41 is, for example, any of a red (R) filter, a green (G) filter, a blue (B) filter, and a white filter (W). The color filter 41 is provided for each pixel P, for example. These color filters 41 are provided in regular color arrangement (e.g., Bayer arrangement). The color filters 41 provided like these allow the imaging device 1 to obtain the pieces of light reception data of colors corresponding to the color arrangement.

The on-chip lens 42 on the color filter 41 is provided for each pixel P at a position opposed to the PD of the sensor chip 11. Light entering the on-chip lens 42 concentrates on the PD for each pixel. The lens system of this on-chip lens 42 is set at a value corresponding to the size of the pixel. Examples of a lens material of the on-chip lens 42 include an organic material, a silicon oxide film (SiO), and the like.

(Method of Manufacturing Imaging Device 1)

It is possible to manufacture the imaging device 1 like this, for example, as follows (FIGS. 6A to 10).

Figure 6A:
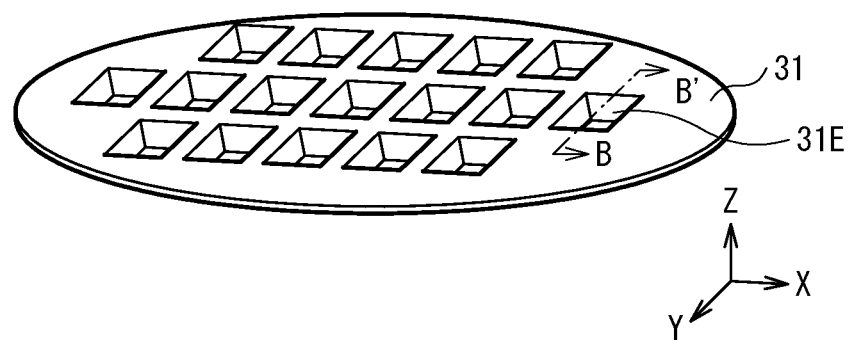
FIG. 6A is a perspective view illustrating a step of a method of manufacturing the imaging device illustrated in FIG. 1.
Figure 6B:
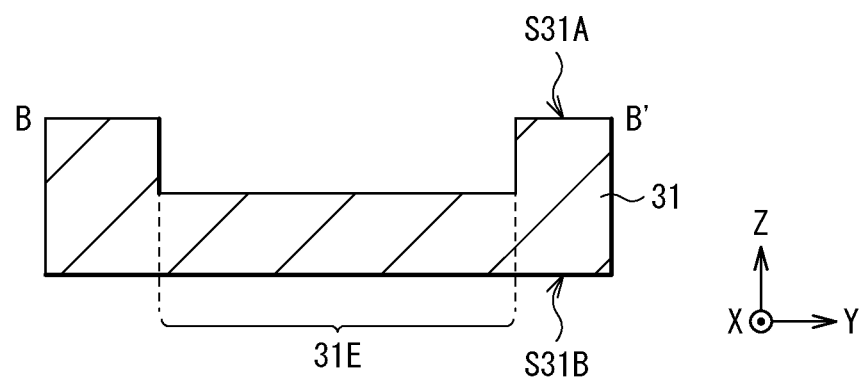
FIG. 6B is a schematic diagram illustrating a cross-sectional configuration taken along a B-B' line illustrated in FIG. 6A.

First, as illustrated in FIGS. 6A and 6B, the plurality of excavated portions 31E is formed in the support substrate 31 including, for example, silicon. FIG. 6A is a schematic perspective view of the support substrate 31. FIG. 6B is a schematic diagram of a cross-sectional configuration taken along the B-B' line illustrated in FIG. 6A. The size and depth of each excavated portion 31E are adjusted in accordance with the size and thickness of the logic chip 21 disposed in the excavated portion 31E. The plurality of excavated portions 31E is disposed in accordance with the wafer map of the sensor chip 11.

Figure 7A:
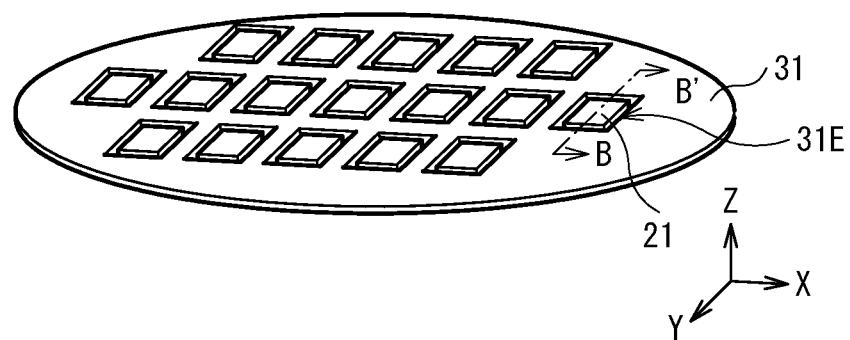
FIG. 7A is a perspective view illustrating a step subsequent to FIG. 6A.
Figure 7B:
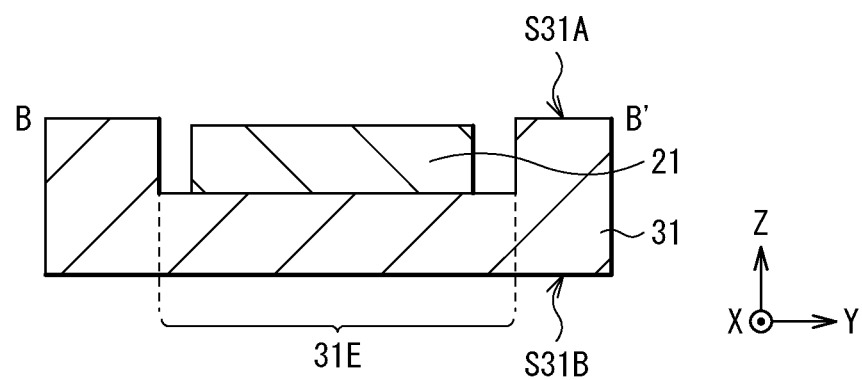
FIG. 7B is a schematic diagram illustrating a cross-sectional configuration taken along a B-B' line illustrated in FIG. 7A.

After the plurality of excavated portions 31E is formed in the support substrate 31, the logic chip 21 is disposed in each of the plurality of excavated portions 31E as illustrated in FIGS. 7A and 7B. FIG. 7A is a schematic perspective view illustrating a step subsequent to FIG. 6A. FIG. 7B is a schematic diagram of a cross-sectional configuration taken along the B-B' line illustrated in FIG. 7A. The logic chip 21 is singulated, for example, from a wafer.

Figure 8:
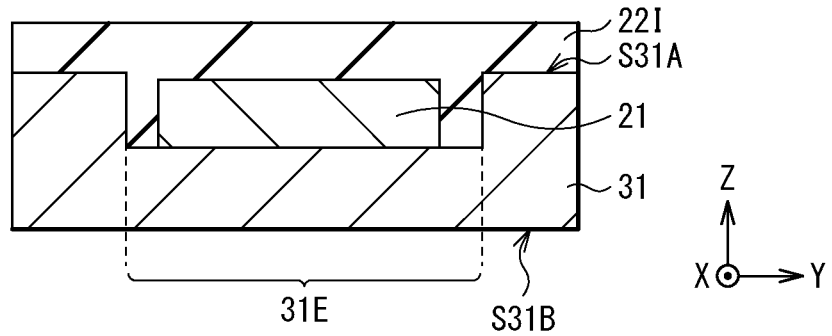
FIG. 8 is a cross-sectional schematic diagram illustrating a step subsequent to FIG. 7B.

After the logic chip 21 is disposed in the excavated portion 31E of the support substrate 31, the insulating film 22I is formed on the support substrate 31 by using a wafer process technology as illustrated in FIG. 8. It is possible to use, for example, CVD (Chemical Vapor Deposition) or the like to form the insulating film 22I. The insulating film 22I is formed to fill the excavated portion 31E.

Figure 9:
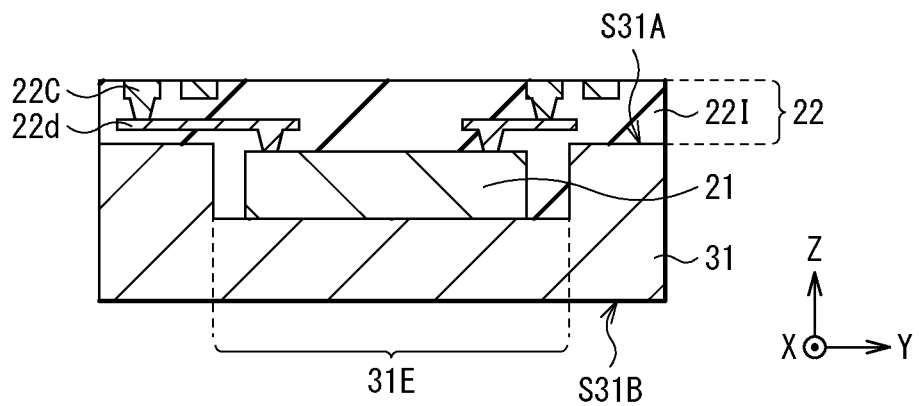
FIG. 9 is a cross-sectional schematic diagram illustrating a step subsequent to FIG. 8.

After the insulating film 22I is formed, the rewiring layer 22d and the contact electrode 22C are formed as illustrated in FIG. 9. This forms the wiring layer 22 on the support substrate 31. The rewiring layer 22d and the contact electrode 22C are formed, by using, for example, a CMOS (Complementary Metal Oxide Semiconductor) process technology. The insulating film 22I then has a surface planarized by CMP or the like. This planarized surface of the insulating film 22I is included in the junction surface S. The logic chip 21 is here provided to the excavated portion 31E of the support substrate 31. The front surface of the logic chip 21 and the front surface S31A of the support substrate 31 thus have a smaller level difference, facilitating the surface of the insulating film 22I to be planarized.

Figure 10:
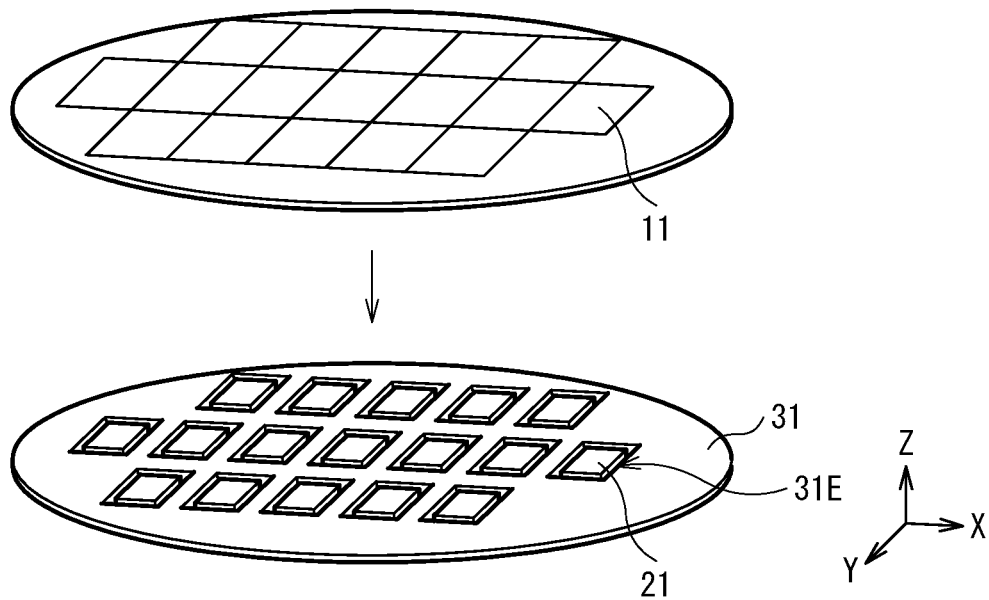
FIG. 10 is a perspective view illustrating a step subsequent to FIG. 9.

After the wiring layer 22 is formed, a wafer provided with the plurality of sensor chips 11 is made to face the support substrate 31 provided with the logic chips 21 as illustrated in FIG. 10 to join the wafers. This couples the contact electrodes 22C of the logic chips 21 and the contact electrodes 11C of the sensor chips 11. Next, the semiconductor substrate 11S of each sensor chip 11 is made thinner. The color filter 41 and the on-chip lens 42 are then formed on the light receiving surface of the sensor chip 11. Afterward, back-grinding is performed to make the support substrate 31 thinner. The excavated portion 31E of the support substrate 31 may then serve as a through hole to expose the back surface of the logic chip 21 from the back surface S31B of the support substrate 31 (see FIG. 5). Finally, dicing is performed to singulate the chips. This completes the imaging device 1 illustrated in FIG. 1.

(Operation of Imaging Device 1)

The imaging device 1 like this acquires a signal charge (e.g., an electron), for example, in the following way. Once light passes through the on-chip lens 42, the color filter 41, and the like to enter the sensor chip 11, this light is detected (absorbed) by the PD of each pixel and red, green or blue light is photoelectrically converted. Signal charges (e.g., electrons) among electron-hole pairs generated by the PD are converted to imaging signals and processed by the logic circuit of the logic chip 21.

(Workings and Effects of Imaging Device 1)

In the present embodiment, the logic chip 21 is disposed in the excavated portion 31E of the support substrate 31. This decreases the level difference between the front surface of the logic chip 21 and the front surface S31A of the support substrate 31 outside the excavated portion 31E, facilitating a planarized surface (junction surface S) to be formed in the wiring layer 22 on the support substrate 31. The following describes these workings and effects.

For example, the logic chip 21 disposed on the support substrate 31 that does not include the excavated portion 31E causes the level difference corresponding to the thickness of the logic chip 21 to be formed on the front surface S31A of the support substrate 31. This level difference makes it difficult to form a planarized surface on the front surface S31A side of the support substrate 31. This less planarization on the front surface S31A side of the support substrate 31 has influence on the coupling between the chips.

Meanwhile, a method is also proposed that couples chips by using a CoW (Chip on Wafer) process. In this method, a plurality of chips disposed in the stacking direction is coupled by using, for example, bump coupling. It is difficult to decrease individual bumps in size. In addition, it is also difficult to decrease the intervals (pitch) between the bumps. This makes it difficult to decrease the imaging device in size. In addition, the chips are coupled at less portions. Further, the bump coupling causes larger capacity, which also increases power consumption. Additionally, the thickness of each bump also increases the entire imaging device in thickness. In addition, it takes a long time to form bumps.

In contrast, in the imaging device 1, the logic chip 21 is disposed in the excavated portion 31E of the support substrate 31. This decreases the level difference between the front surface of the logic chip 21 and the front surface S31A of the support substrate 31 outside the excavated portion 31E as compared with a case where the support substrate 31 does not provided with the excavated portion 31E. It is easier to form a planarized surface (surface of wiring layer 22) on the front surface S31A side of the support substrate 31. This planarized surface (junction surface S) makes it possible to electrically couple the logic chip 21 and the sensor chip 11 with ease. Especially CuCu junction requires the junction surface S to be highly planarized and is favorably used for the present technology.

In addition, in the imaging device 1, a planarized surface is formed on the front surface S31A side of the support substrate 31 as described above. This makes it possible to easily join the plurality of logic chips 21 tiled on the support substrate 31 to the sensor chips 11 each in the state of a wafer (FIG. 10). That is, it is possible to couple the sensor chips 11 and the logic chips 21 by using no CoW process. It is thus possible to couple the sensor chips 11 and the logic chips 21 without using the bump coupling, which has a problem as described above. For example, electrically coupling the sensor chips 11 and the logic chips 21 by using CuCu junction makes it possible to decrease the imaging device 1 in size. In addition, it is possible to couple the sensor chips 11 and the logic chip 21 at more portions. Further, it is also possible to decrease the power consumption of the imaging device 1. Additionally, it is also possible to decrease the entire imaging device 1 in thickness. In addition, it possible to decrease the time necessary to manufacture the imaging device 1.

As described above, in the present embodiment, the logic chip 21 is disposed in the excavated portion 31E of the support substrate 31. This makes it possible to form a planarized surface in the wiring layer 22 on the front surface S31A side of the support substrate 31 provided with the logic chip 21. The sensor chip 11 is coupled to the logic chip 21 with this planarized surface therebetween. This makes it possible to more simplify the electrical coupling between the sensor chip 11 and the logic chip 21 disposed in the stacking direction.

In addition, the wiring layer 22 provided between the support substrate 31 and the sensor chip 11 makes it possible to provide a function to the space between the logic chip 21 and the sensor chip 11. For example, this wiring layer 22 makes it possible to freely design a wiring line even in a region that does not overlap with the logic chip 21 in a plan view.

Further, the rewiring layer 22d of the wiring layer 22 allows the position of the contact electrode 22C to be adjusted. This facilitates the contact electrode 22C and the contact electrode 11C to be aligned.

The following describes modification examples of the above-described embodiment and another embodiment, but the following description denotes the same components as those of the above-described embodiment with the same reference sings and omits the description thereof as appropriate.

Modification Example 1

Figure 11:
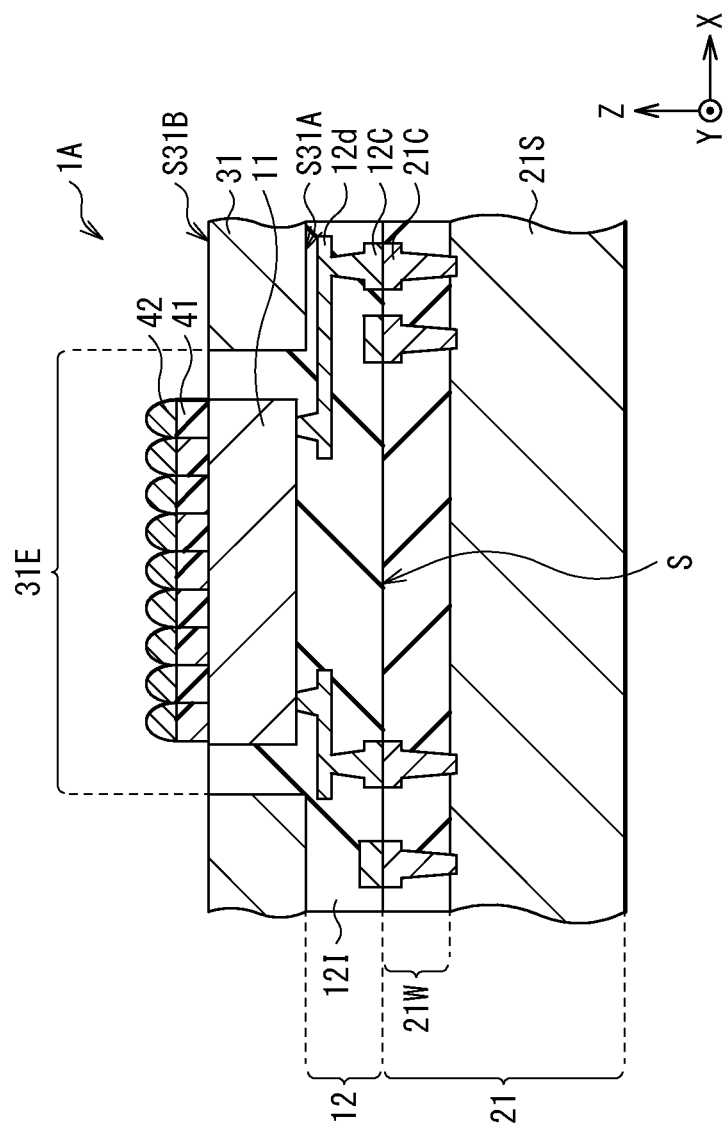
FIG. 11 is a cross-sectional schematic diagram illustrating a configuration of a main unit of an imaging device according to a modification example 1.

FIG. 11 illustrates a schematic cross-sectional configuration of the main unit of an imaging device (imaging device 1A) according to a modification example 1 of the above-described first embodiment. In this imaging device 1A, the sensor chip 11 is disposed in the excavated portion 31E of the support substrate 31. Except for this point, the imaging device 1A according to the modification example 1 has a configuration similar to that of the imaging device 1 according to the above-described first embodiment and also attains similar workings and effects.

In a plan view, the size of this sensor chip 11 is less than the size of the logic chip 21. For example, the light receiving surface of the sensor chip 11 is disposed on the back surface S31B side of the support substrate 31. The color filter 41 and the on-chip lens 42 are provided on the sensor chip 11 exposed from the back surface S31B of the support substrate 31. There is provided a wiring layer 12 between the support substrate 31 and the logic chip 21. The logic chip 21 is disposed to be opposed to the support substrate 31 with this wiring layer 12 interposed therebetween. The logic chip 21 includes, for example, a semiconductor substrate 21S and a multilayer wiring layer 21W. The junction surface S is provided between these multilayer wiring layer 21W and wiring layer 12.

The wiring layer 12 provided between the support substrate 31 and the logic chip 21 (more specifically, multilayer wiring layer 21W) includes an insulating film 12I, a rewiring layer 12d, and a contact electrode 12C. The rewiring layer 12d is for coupling the sensor circuit of the sensor chip 11 and the contact electrode 12C. The contact electrode 12C is for coupling the rewiring layer 12d and the contact electrode 11C. This contact electrode 12C includes, for example, copper (Cu) and has one of the surfaces exposed to the junction surface S. The wiring layer 12 has a planarized surface that is formed, for example, through a planarization process such as CMP. This planarized surface is included in the junction surface S with the logic chip 21.

The logic chip 21 includes the multilayer wiring layer 21W and the semiconductor substrate 21S in this order from the side close to the rewiring layer 12 side. The multilayer wiring layer 21W includes a contact electrode 21C. The contact electrode 21C is for coupling the logic circuit provided to the semiconductor substrate 21S and the contact electrode 12C. This contact electrode 21C includes, for example, copper (Cu) and has one of the surfaces exposed to the junction surface S. The contact electrode 21C is in contact with the contact electrode 12C on the junction surface S. This coupling between the contact electrodes 12C and 21C is, for example, CuCu junction. That is, the sensor chip 11 is electrically coupled to the logic chip 21, for example, by CuCu junction.

In the present modification example, the sensor chip 11 is also disposed in the excavated portion 31E of the support substrate 31. This makes it possible to form a planarized surface in the wiring layer 12 on the front surface S31A side of the support substrate 31 provided with the sensor chip 11. The logic chip 21 is coupled to the sensor chip 11 with this planarized surface therebetween. This makes it possible to more simplify the electrical coupling between the sensor chip 11 and the logic chip 21 disposed in the stacking direction.

Modification Example 2

Figure 12:
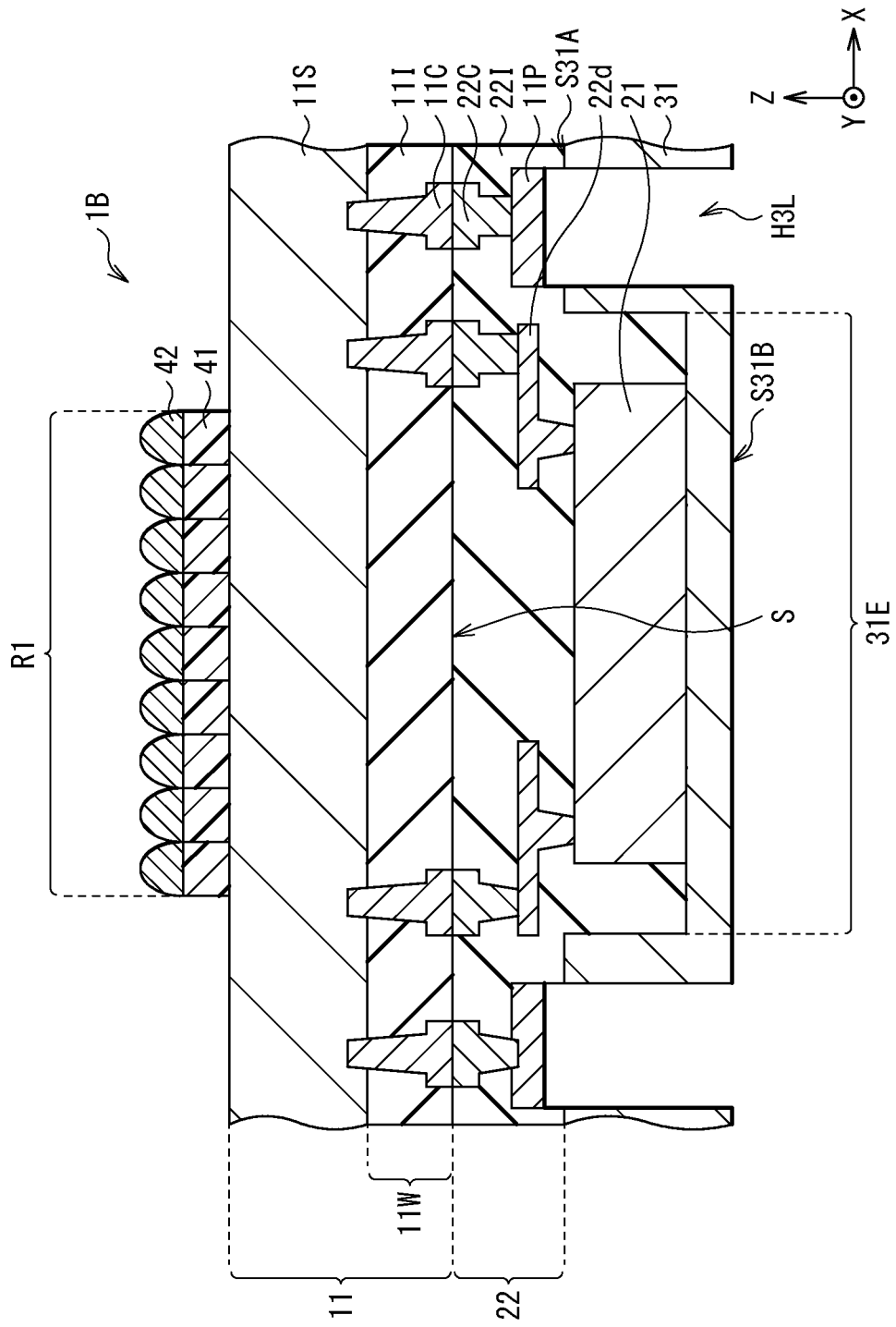
FIG. 12 is a cross-sectional schematic diagram illustrating a configuration of a main unit of an imaging device according to a modification example 2.

FIG. 12 illustrates a schematic cross-sectional configuration of the main unit of an imaging device (imaging device 1B) according to a modification example 2 of the above-described first embodiment. This imaging device 1B is CSP (Chip Size Package) and is provided with the pad electrode 11P on the logic chip 21 side. Except for this point, the imaging device 1B according to the modification example 2 has a configuration similar to that of the imaging device 1 according to the above-described first embodiment and also attains similar workings and effects.

The pad electrode 11P is provided, for example, to the wiring layer 22. The pad electrode 11P is disposed at a position that does not overlap with the logic chip 21 in a plan view. The pad electrode 11P is disposed, for example, in the same layer as the rewiring layer 22d. The pad electrode 11P and the rewiring layer 22d each include, for example, aluminum (Al) or the like.

The support substrate 31 has a through hole at a position opposed to the pad electrode 11P. This through hole reaches the pad electrode 11P. This allows for coupling from the back surface S31B side of the support substrate 31 or the logic chip 21 side to the outside.

The logic chip 21 may be provided with a pad electrode as an external coupling terminal, but it is necessary to process the logic chip 21 in this case. The logic chip 21 may be therefore subjected to the influence of PID (Plasma Induced Damage). The pad electrode 11P provided to the wiring layer 22 between the support substrate 31 and the sensor chip 11 makes it possible to suppress this influence of PID on the logic chip 21.

In the present modification example, the logic chip 21 is also disposed in the excavated portion 31E of the support substrate 31. This makes it possible to form a planarized surface in the wiring layer 22 on the front surface S31A side of the support substrate 31 provided with the logic chip 21. The sensor chip 11 is coupled to the logic chip 21 with this planarized surface therebetween. This makes it possible to more simplify the electrical coupling between the sensor chip 11 and the logic chip 21 disposed in the stacking direction. In addition, the pad electrode 11P provided to the wiring layer 22 makes it possible to achieve CSP while suppressing the influence of PID on the logic chip 21.

Modification Example 3

Figure 13:
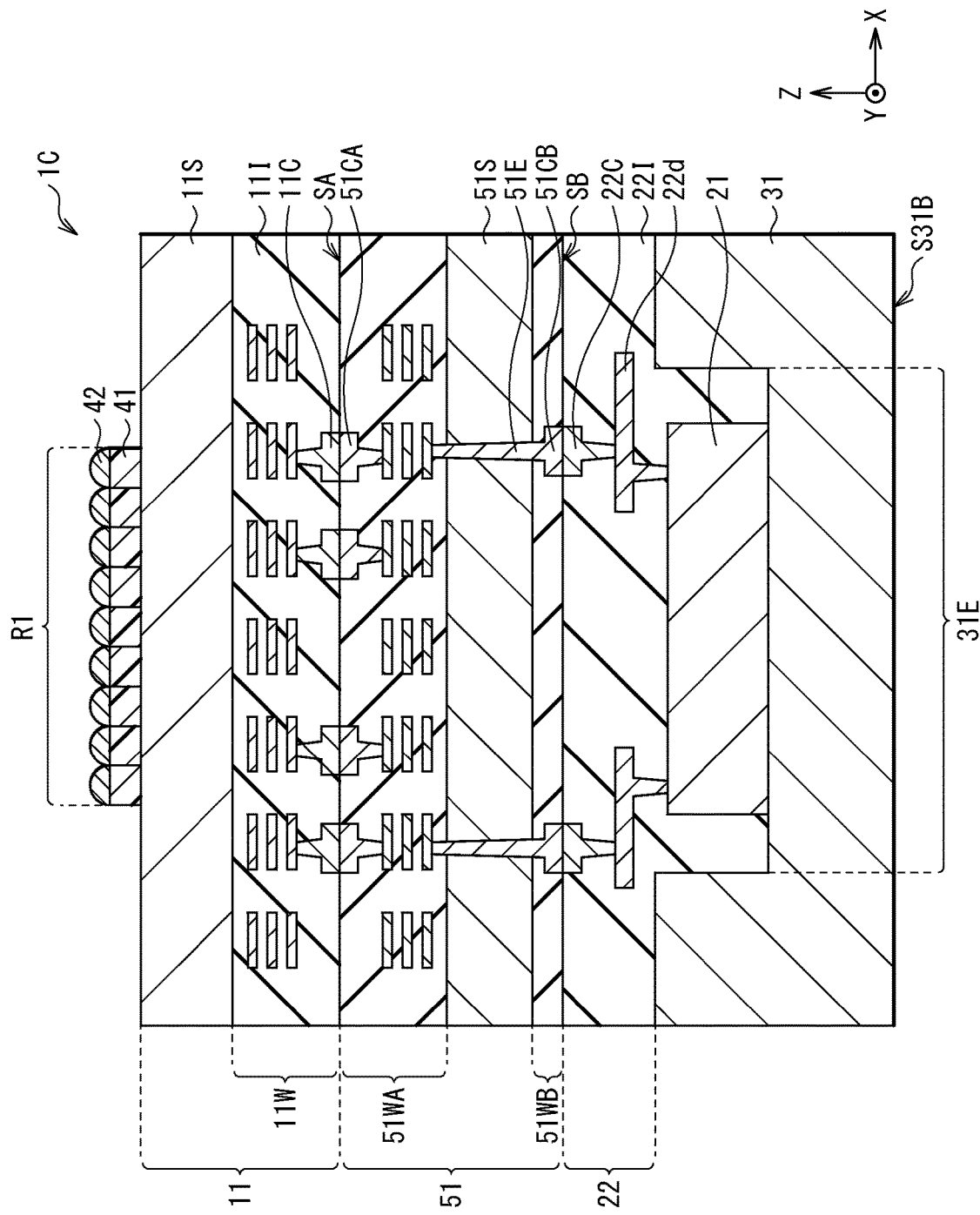
FIG. 13 is a cross-sectional schematic diagram illustrating a configuration of a main unit of an imaging device according to a modification example 3.

FIG. 13 illustrates a schematic cross-sectional configuration of the main unit of an imaging device (imaging device 1C) according to a modification example 3 of the above-described first embodiment. This imaging device 1C further includes a logic chip 51 (third chip) between the sensor chip 11 and the logic chip 21 (support substrate 31). That is, in the imaging device 1C, the logic chip 21 disposed in the excavated portion 31E of the support substrate 31 is joined to a stacked chip including the sensor chip 11 and the logic chip 51. Except for this point, the imaging device 1C according to the modification example 3 has a configuration similar to that of the imaging device 1 according to the above-described first embodiment and also attains similar workings and effects.

The logic chip 51 includes, for example, a multilayer wiring layer 51WA, a semiconductor substrate 51S, and a multilayer wiring layer 51WB in this order from the sensor chip 11 side. There is provided a junction surface SA between the multilayer wiring layer 51WA and the multilayer wiring layer 11W of the sensor chip 11 and there is provided a junction surface SB between the multilayer wiring layer 51WB and the wiring layer 22.

The multilayer wiring layer 51WA includes a contact electrode 51CA. The contact electrode 51CA is for coupling the logic circuit provided to the logic chip 51 and the contact electrode 11C. This contact electrode 51CA includes, for example, copper (Cu) and has one of the surfaces exposed to the junction surface SA. The contact electrode 51CA is in contact with the contact electrode 11C on the junction surface S. This coupling between the contact electrodes 11C and 51CA is, for example, CuCu junction. That is, the sensor chip 11 is electrically coupled to the logic chip 51, for example, by CuCu junction. The contact electrodes 11C and 51CA are disposed, for example, at positions overlapping with the pixel region R1 in a plan view.

The multilayer wiring layer 51WB opposed to the multilayer wiring layer 51WA with the semiconductor substrate 51S interposed therebetween includes a contact electrode 51CB. The contact electrode 51CB is for coupling the logic circuit provided to the semiconductor substrate 51S and the contact electrode 22C. This contact electrode 51CB includes, for example, copper (Cu) and has one of the surfaces exposed to the junction surface SB. The contact electrode 51CB is in contact with the contact electrode 22C on the junction surface SB. This coupling between the contact electrodes 22C and 51CB is, for example, CuCu junction. That is, the logic chip 21 is electrically coupled to the logic chip 51, for example, by CuCu junction. The contact electrodes 22C and 51CB are disposed, for example, at positions that do not overlap with the pixel region R1 in a plan view.

The contact electrode 51CB of the multilayer wiring layer 51WB is coupled to a wiring line of the multilayer wiring layer 51WA via a through electrode 51E that penetrates the semiconductor substrate 51S. The through electrode 51E is, for example, TSV.

In the present modification example, the logic chip 21 is also disposed in the excavated portion 31E of the support substrate 31. This makes it possible to form a planarized surface in the wiring layer 22 on the front surface S31A side of the support substrate 31 provided with the logic chip 21. The logic chip 51 is coupled to the logic chip 21 with this planarized surface (junction surface SB) therebetween. This makes it possible to more simplify the electrical coupling between the logic chip 51 and the logic chip 21 disposed in the stacking direction.

FIG. 13 illustrates the example in which the imaging device 1C has a stacked structure of three chips (sensor chip 11 and logic chips 21 and 51), but the imaging device 1C may have a stacked structure of four or more chips.

In addition, FIG. 13 illustrates the example in which the logic chip 21 is disposed in the excavated portion 31E of the support substrate 31, but a chip having another function may be disposed in the excavated portion 31E. For example, a memory chip such as DRAM (Dynamic Random Access Memory) may be disposed in the excavated portion 31E.

Second Embodiment

Figure 14:
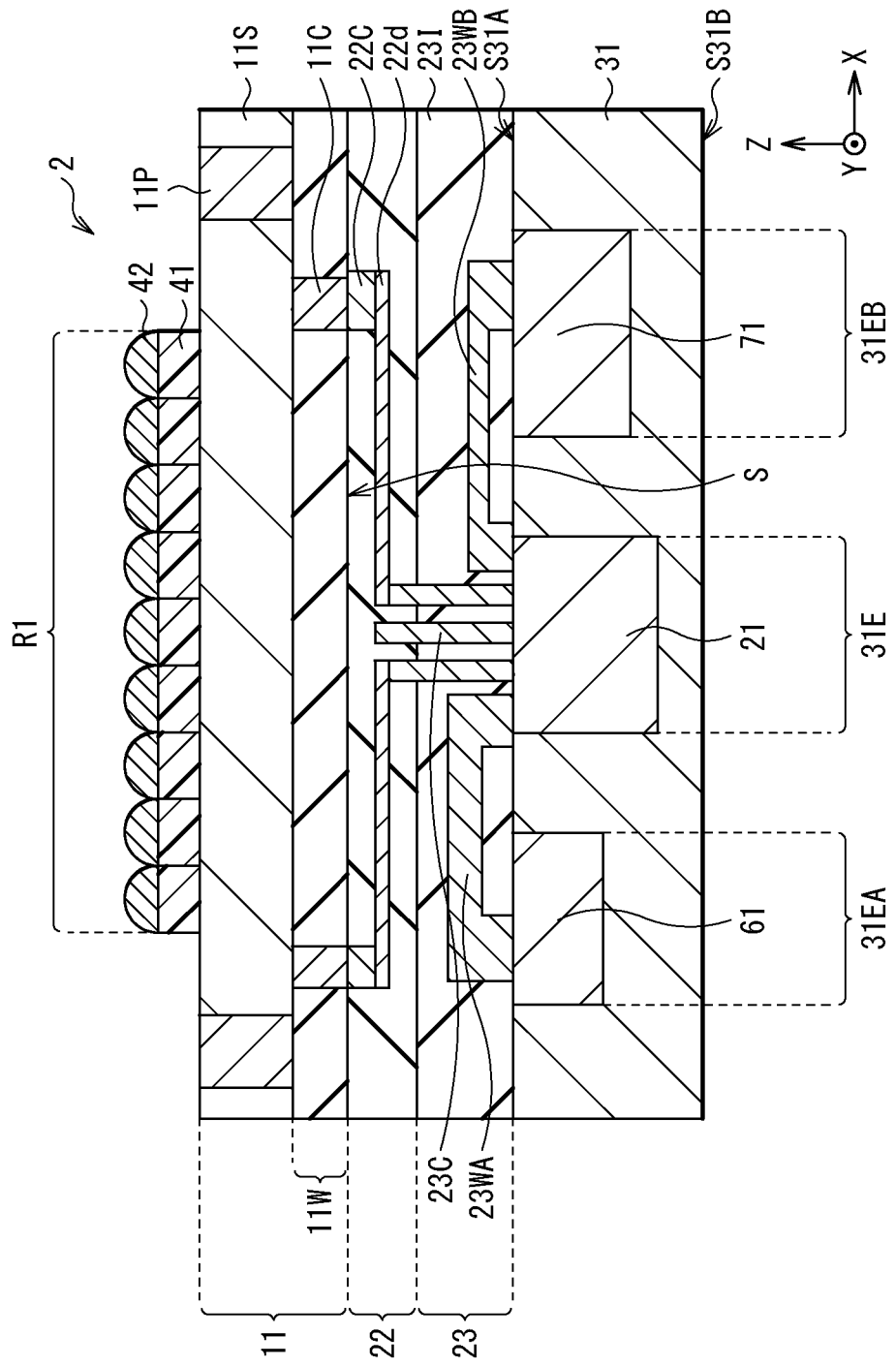
FIG. 14 is a cross-sectional schematic diagram illustrating a configuration of a main unit of an imaging device according to a second embodiment of the present disclosure.

FIG. 14 illustrates a schematic cross-sectional configuration of the main unit of an imaging device (imaging device 2) according to a second embodiment of the present disclosure. In this imaging device 2, the support substrate 31 includes a plurality of excavated portions (excavated portions 31E, 31EA, and 31EB) and chips (logic chip 21, first memory chip 61, and second memory chip 71) are disposed in the respective excavated portions. Except for this point, the imaging device 2 according to the second embodiment has a configuration similar to that of the imaging device 1 according to the above-described first embodiment and also attains similar workings and effects.

The support substrate 31 of the imaging device 2 includes, for example, the three excavated portions 31E, 31EA, and 31EB. The logic chip 21 is disposed in the excavated portion 31E, the first memory chip 61 is disposed in the excavated portion 31EA, and the second memory chip 71 is disposed in the excavated portion 31EB. The imaging device 2 includes a wiring layer 23 (second wiring layer), the wiring layer 22, and the sensor chip 11 on this support substrate 31 in this order.

The excavated portions 31E, 31EA, and 31EB are each provided from the front surface S31A to the back surface S31B side of the support substrate 31 to have, for example, the shape of a recess. These excavated portions 31E, 31EA, and 31EB are respectively provided to have the shapes corresponding to the logic chip 21, the first memory chip 61, and the second memory chip 71 and are different from each other in depth.

Figure 15:
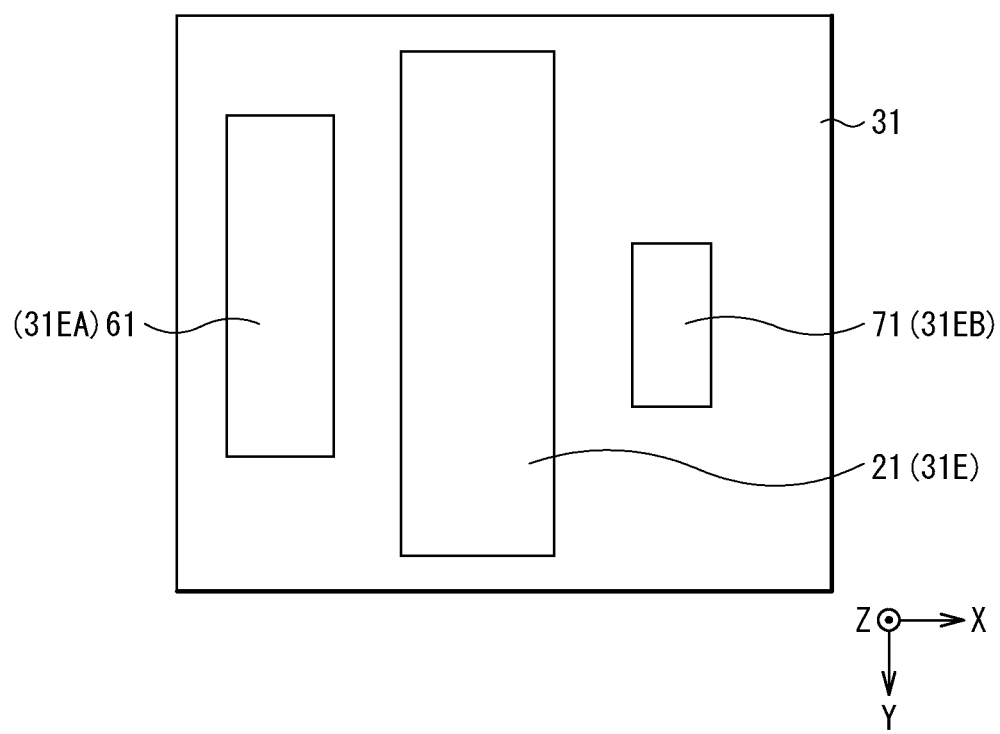
FIG. 15 is a schematic diagram illustrating an example of a planar configuration of a support substrate illustrated in FIG. 14.

FIG. 15 schematically illustrates planar configurations of the logic chip 21, the first memory chip 61, and the second memory chip 71 disposed on the support substrate 31. The excavated portions 31E, 31EA, and 31EB respectively have the planar shapes corresponding to the logic chip 21, the first memory chip 61, and the second memory chip 71 and are different from each other in area (size in a plan view). For example, the first memory chip 61, the logic chip 21, and the second memory chip 71 are disposed side by side in this order from an end (left end of FIG. 15) of the support substrate 31.

The excavated portion 31E is provided, for example, to the central portion of the support substrate 31. This excavated portion 31E has substantially the same planar shape as that of the logic chip 21. The excavated portion 31E has, for example, a quadrangular planar shape. In a plan view, the size of the excavated portion 31E is substantially the same as the size of the logic chip 21 or greater than the size of the logic chip 21. It is preferable that the depth of the excavated portion 31E be substantially the same as the thickness of the logic chip 21.

The excavated portion 31EA is disposed, for example, between the excavated portion 31E and an end of the support substrate 31. This excavated portion 31EA has substantially the same planar shape as that of the first memory chip 61. The excavated portion 31EA has, for example, a quadrangular planar shape and this quadrangle is smaller than the excavated portion 31E. In a plan view, the size of the excavated portion 31EA is substantially the same as the size of the first memory chip 61 or greater than the size of the first memory chip 61. It is preferable that the depth of the excavated portion 31EA be substantially the same as the thickness of the first memory chip 61. The excavated portion 31EA is provided, for example, to be shallower than the excavated portion 31E.

The excavated portion 31EB is disposed, for example, between the excavated portion 31E and the other end of the support substrate 31. This excavated portion 31EB has substantially the same planar shape as that of the second memory chip 71. The excavated portion 31EB has, for example, a quadrangular planar shape and this quadrangle is smaller than the excavated portion 31EA. In a plan view, the size of the excavated portion 31EB is substantially the same as the size of the second memory chip 71 or greater than the size of the second memory chip 71. It is preferable that the depth of the excavated portion 31EB be substantially the same as the thickness of the second memory chip 71. The excavated portion 31EB is provided, for example, to be shallower than the excavated portion 31E and deeper than the excavated portion 31EA.

Figure 16:
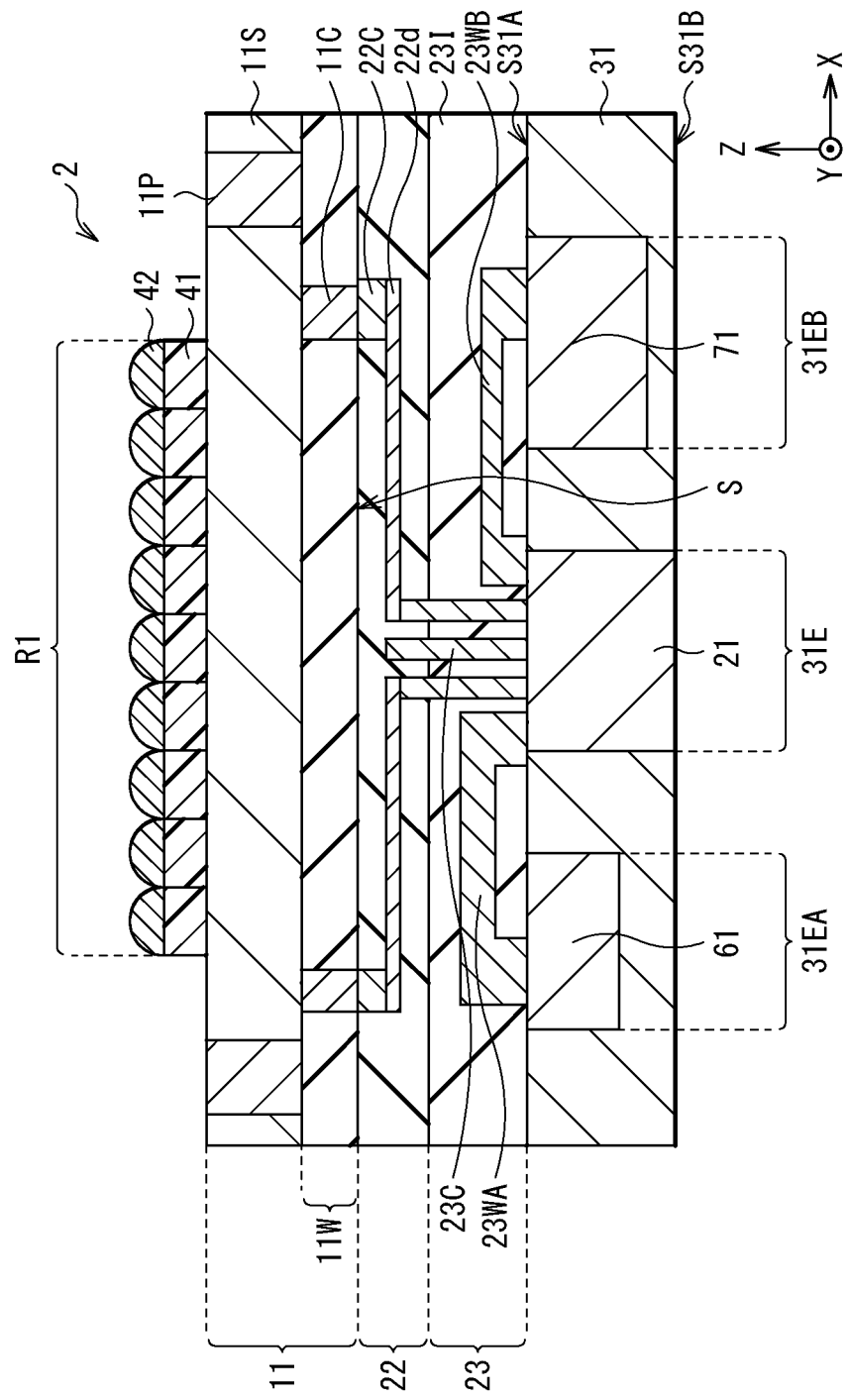
FIG. 16 is a cross-sectional schematic diagram illustrating another example of a configuration of the imaging device illustrated in FIG. 14.

FIG. 16 illustrates other examples of the configurations of the excavated portions 31E, 31EA, and 31EB. In this way, the excavated portion 31E may be provided to have the shape of a hole. The logic chip 21 that is the greatest of the logic chip 21, the first memory chip 61, and the second memory chip 71 in thickness is disposed in the excavated portion 31E. At this excavated portion 31E, the back surface of the logic chip 21 is exposed from the back surface S31B of the support substrate 31.

The first memory chip 61 disposed in the excavated portion 31EA is, for example, a volatile memory such as DRAM (Dynamic Random Access Memory). The first memory chip 61 includes a first memory circuit that is electrically coupled to the logic circuit of the logic chip 21. The first memory chip 61 is electrically coupled to the logic chip 21 by a wiring line (wiring line 23WA described below) of the wiring layer 23.

The second memory chip 71 disposed in the excavated portion 31EB is, for example, a non-volatile memory. The second memory chip 71 includes a second memory circuit that is electrically coupled to the logic circuit of the logic chip 21. The second memory chip 71 is electrically coupled to the logic chip 21 by a wiring line (wiring line 23WB described below) of the wiring layer 23.

The logic chip 21 electrically coupled to the first memory chip 61 and the second memory chip 71 serves for the main function among the three chips (logic chip 21, first memory chip 61, and second memory chip 71) disposed on the support substrate 31. This logic chip 21 is electrically coupled to the sensor chip 11 via a contact electrode (contact electrode 23C described below) of the wiring layer 23 and the rewiring layer 22d and the contact electrode 22C of the wiring layer 22.

The wiring layer 23 provided between the support substrate 31 and the wiring layer 22 includes an insulating film 23I, the wiring lines 23WA and 23WB, and the contact electrode 23C. The insulating film 23I is for separating wiring lines of the wiring layer 23 and includes, for example, silicon oxide (SiO) or the like. The wiring line 23WA is for coupling the first memory circuit of the first memory chip 61 to the logic circuit of the logic chip 21. The wiring line 23WB is for coupling the second memory circuit of the second memory chip 71 to the logic circuit of the logic chip 21. The contact electrode 23C is for coupling the memory circuit of the logic chip 21 to the rewiring layer 22d of the wiring layer 22 and is provided by penetrating the wiring layer 23. This contact electrode 23C is disposed at a position overlapping with the logic chip 21 in a plan view. The rewiring layer 22d of the wiring layer 22 couples the contact electrode 23C of the wiring layer 23 and the contact electrode 22C. The junction surface S is provided between the wiring layer 22 and the sensor chip 11 (more specifically, multilayer wiring layer 11W).

It is possible to manufacture the imaging device 2 like this, for example, as follows (FIGS. 17 to 22B).

Figure 17:
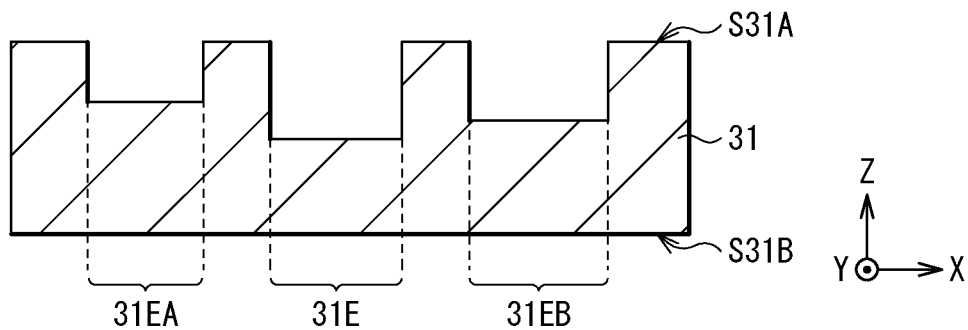
FIG. 17 is a cross-sectional schematic diagram illustrating a step of a method of manufacturing the imaging device illustrated in FIG. 14.
Figure 18:
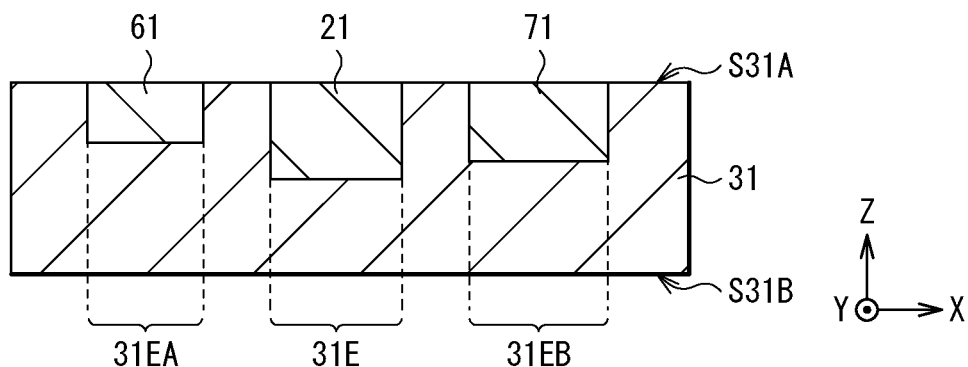
FIG. 18 is a cross-sectional schematic diagram illustrating a step subsequent to FIG. 17.

First, as illustrated in FIG. 17, the plurality of respective excavated portions 31E, 31EA, and 31EB is formed in the wafer-shaped support substrate 31 (see FIG. 6A). Next, as illustrated in FIG. 18, the logic chip 21 is disposed in each of the excavated portions 31E, the first memory chip 61 is disposed in each of the excavated portions 31EA, and the second memory chip 71 is disposed in each of the excavated portions 31EB. The logic chip 21, the first memory chip 61, and the second memory chip 71 are each singulated, for example, from a wafer.

Figure 19:
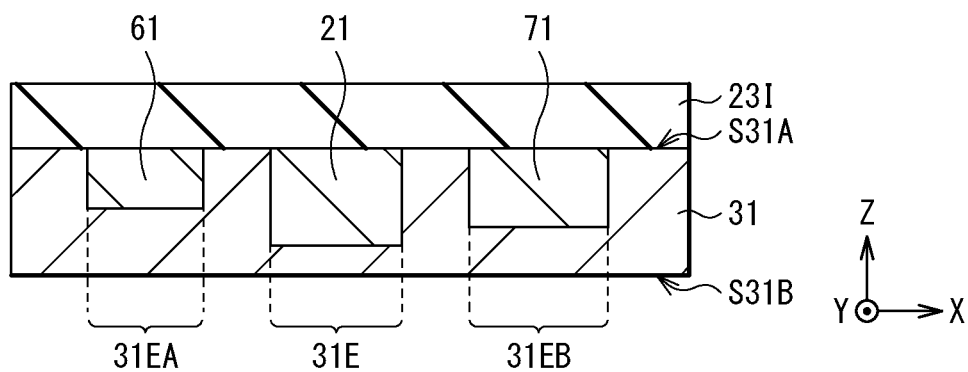
FIG. 19 is a cross-sectional schematic diagram illustrating a step subsequent to FIG. 18.

Next, as illustrated in FIG. 19, the insulating film 23I is formed on the support substrate 31 by using, for example, CVD. After the insulating film 23I is formed, the surface of the insulating film 23I is planarized by CMP or the like.

Figure 20A:
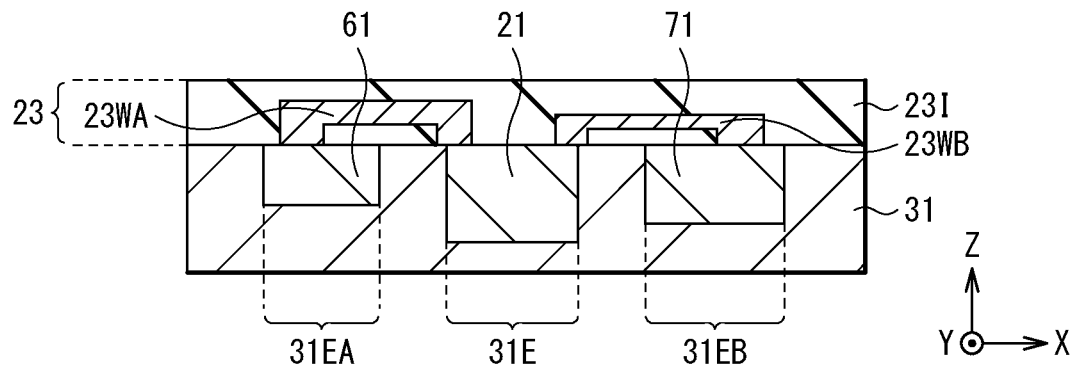
FIG. 20A is a cross-sectional schematic diagram illustrating a step subsequent to FIG. 19.
Figure 20B:
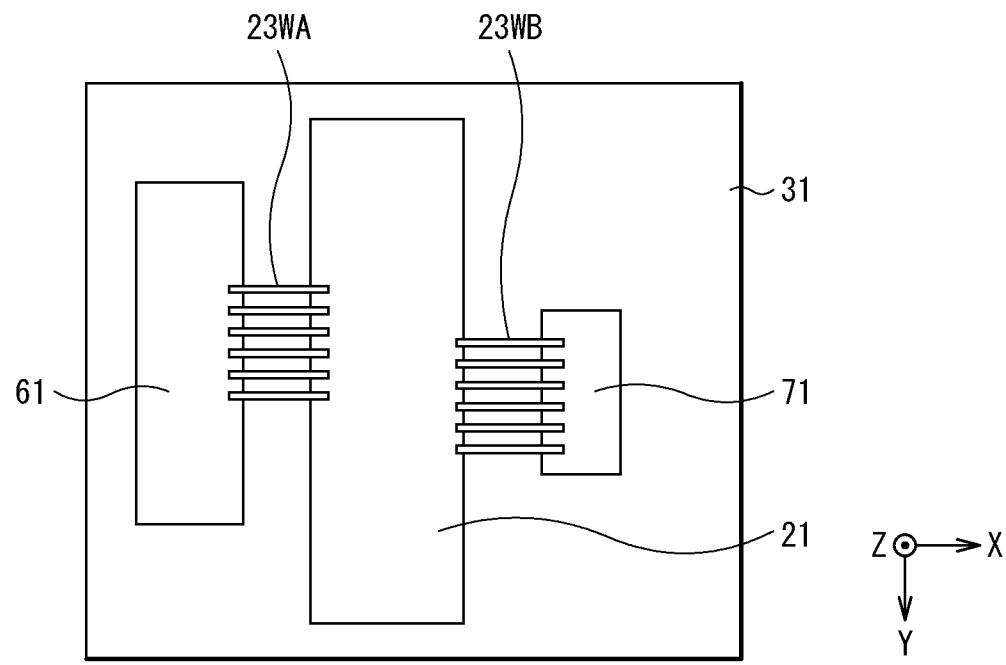
FIG. 20B is a schematic diagram illustrating a planar configuration in the step illustrated in FIG. 20A.

After the insulating film 23I is formed, the wiring lines 23WA and 23WB are formed as illustrated in FIGS. 20A and 20B. FIG. 20A illustrates a cross-sectional configuration in a step subsequent to FIG. 19 and FIG. 20B illustrates a planar configuration in the step illustrated in FIG. 20A.

Figure 21A:
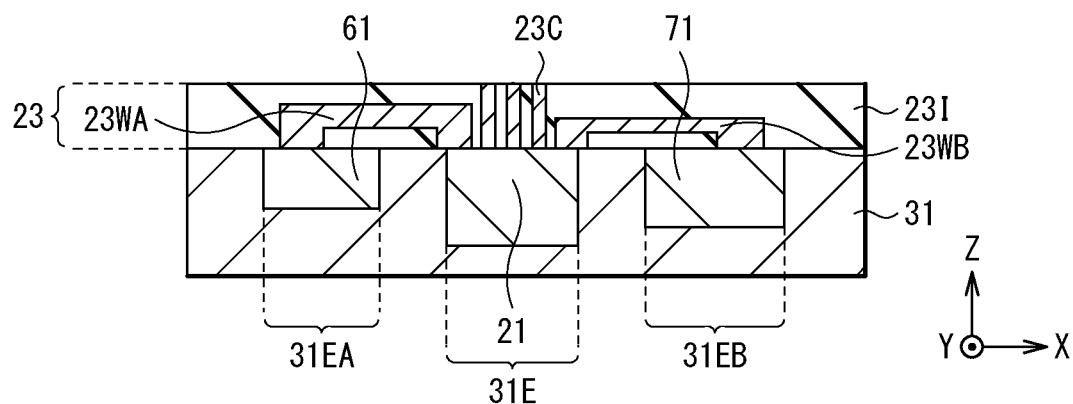
FIG. 21A is a cross-sectional schematic diagram illustrating a step subsequent to FIG. 20A.
Figure 21B:
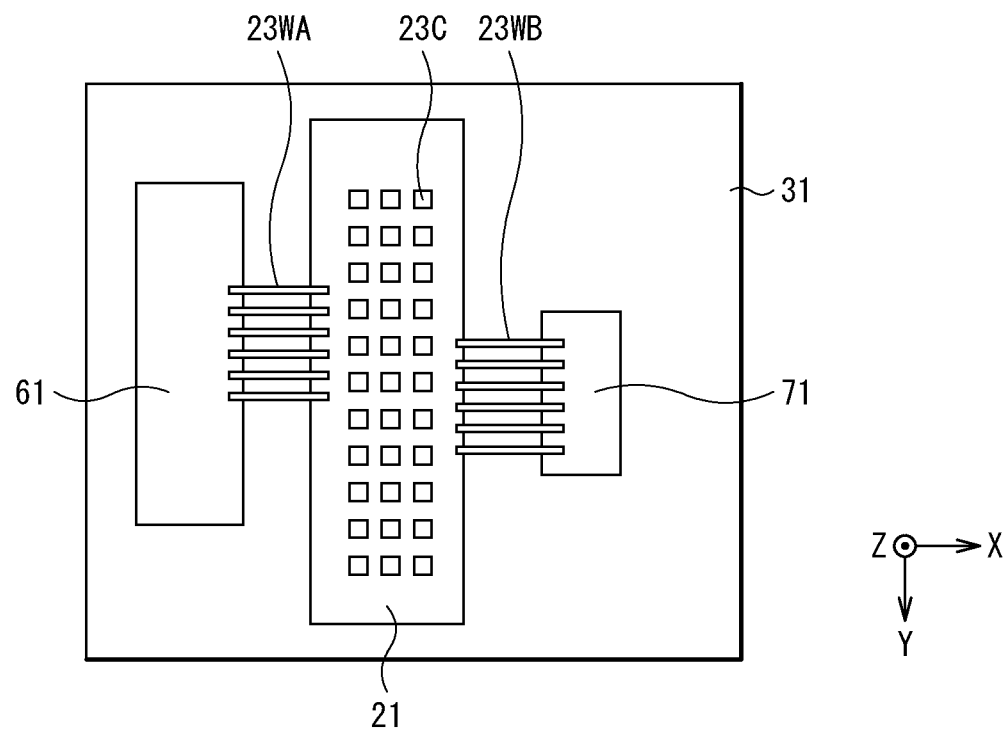
FIG. 21B is a schematic diagram illustrating a planar configuration in the step illustrated in FIG. 21A.

After the wiring lines 23WA and 23WB are formed, the contact electrode 23C is formed as illustrated in FIGS. 21A and 21B. This forms the wiring layer 23 on the support substrate 31. FIG. 21A illustrates a cross-sectional configuration in a step subsequent to FIG. 20A and FIG. 21B illustrates a planar configuration in the step illustrated in FIG. 21A.

Figure 22A:
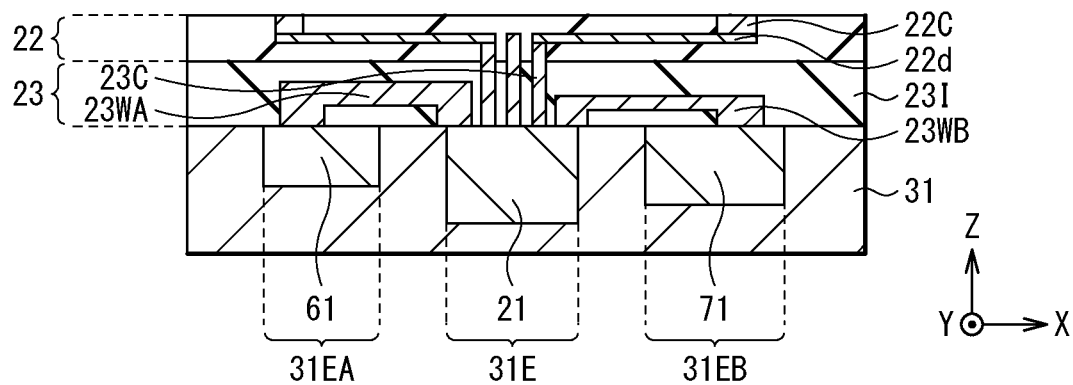
FIG. 22A is a cross-sectional schematic diagram illustrating a step subsequent to FIG. 21A.
Figure 22B:
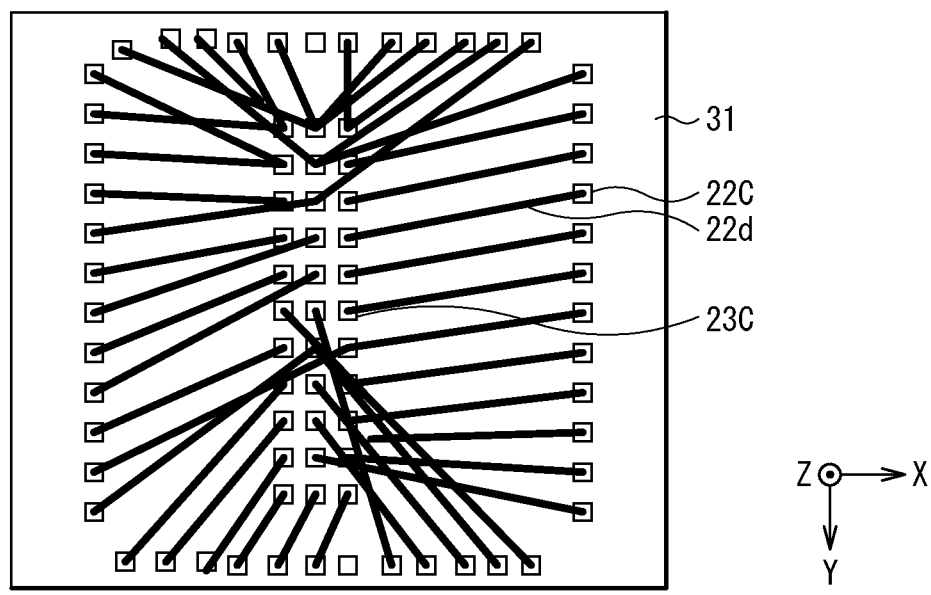
FIG. 22B is a schematic diagram illustrating a planar configuration in the step illustrated in FIG. 22A.

After the wiring layer 23 is formed, the wiring layer 22 is formed on the wiring layer 23 as illustrated in FIGS. 22A and 22B. The wiring layer 22 is formed, for example, as follows. The insulating film 22I is first formed on the wiring layer 23 and the surface of the insulating film 22I is then planarized, for example, by CMP or the like. This planarized surface of the insulating film 22I is included in the junction surface S. After the insulating film 22I is planarized, the rewiring layer 22d and the contact electrode 22C are formed. This forms the wiring layer 22.

After the wiring layer 22 is formed, a wafer provided with the plurality of sensor chips 11 is made to face the support substrate 31 provided with the logic chips 21, the first memory chips 61, and the second memory chips 71 to join the wafers. This couples the contact electrodes 22C of the wiring layer 22 and the contact electrodes 11C of the sensor chips 11. Here, the wiring lines 23WA and 23WB of the wiring layer 23 electrically couples the first memory chip 61 and the second memory chip 71 to the logic chip 21, respectively. This eliminates the necessity to directly join the first memory chip 61 and the second memory chip 71 each to the sensor chip 11. It is thus possible to easily join the wafers.

After the wafers are joined, it is possible to complete the imaging device 2 through the steps similar to those described in the above-described first embodiment.

The imaging device 2 according to the present embodiment also has the logic chip 21, the first memory chip 61, and the second memory chip 71 disposed in the excavated portions 31E, 31EA, and 31EB of the support substrate 31. It is thus possible to form a planarized surface in the wiring layer 22 on the front surface S31A side of the support substrate 31. The sensor chip 11 is coupled to the logic chip 21 with this planarized surface (junction surface S) therebetween. This makes it possible to more simplify the electrical coupling between the sensor chip 11 and the logic chip 21 disposed in the stacking direction.

In addition, the wiring layer 23 including the wiring lines 23WA and 23WB is provided between the support substrate 31 and the wiring layer 22, thereby allowing the first memory chip 61 and the second memory chip 71 to be electrically coupled to the logic chip 21 serving for the main function. This makes it possible to easily perform a step of joining the wafers.

Modification Example 4

Figure 23:
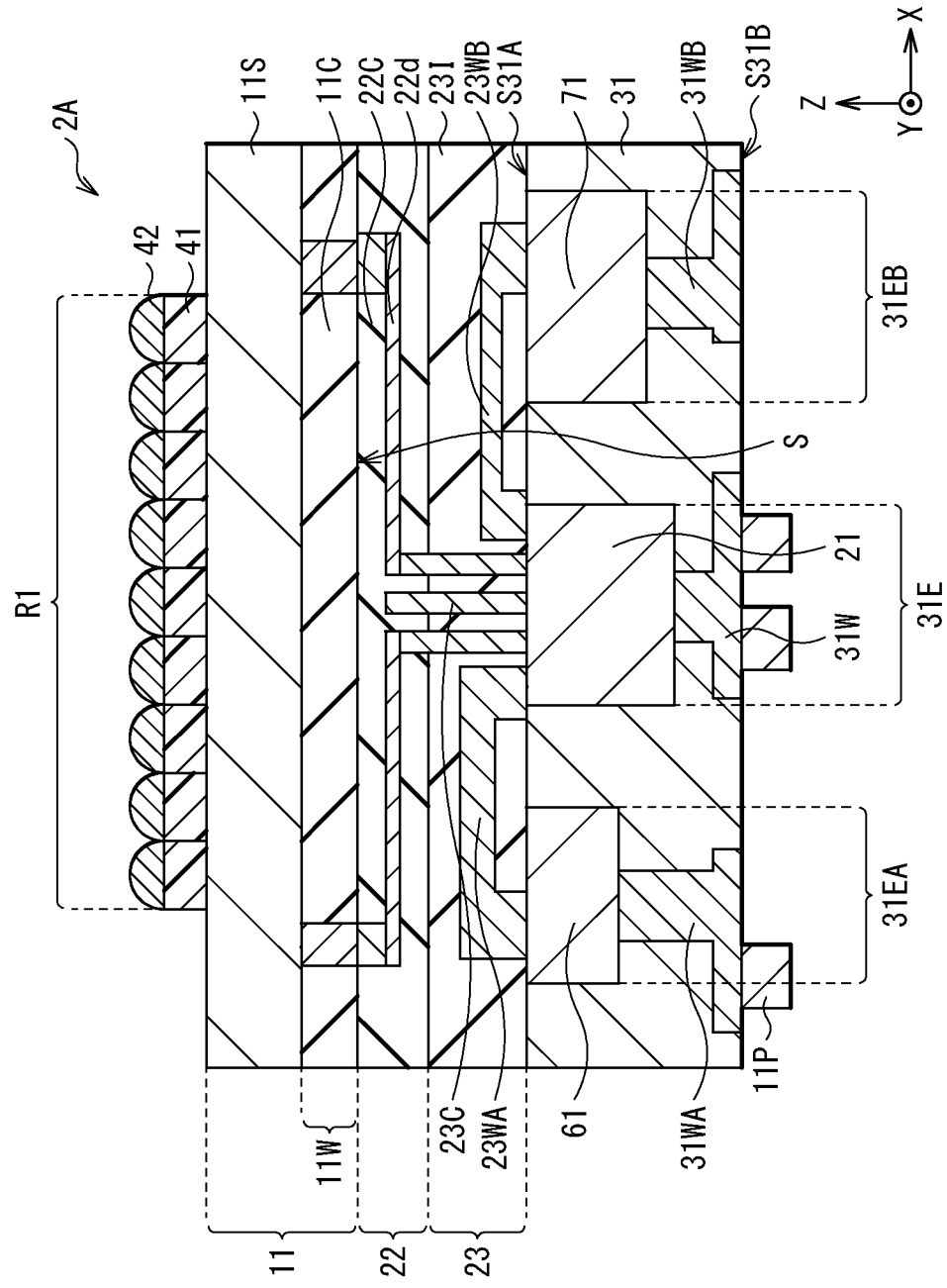
FIG. 23 is a cross-sectional schematic diagram illustrating a configuration of a main unit of an imaging device according to a modification example 4.

FIG. 23 illustrates a schematic cross-sectional configuration of the main unit of an imaging device (imaging device 2A) according to a modification example (modification example 4) of the above-described second embodiment. This imaging device 2A is CSP and is provided with the pad electrode 11P on the back surface S31B of the support substrate 31. Except for this point, the imaging device 2A according to the modification example 4 has a configuration similar to that of the imaging device 2 according to the above-described second embodiment and also attains similar workings and effects.

Figure 24:
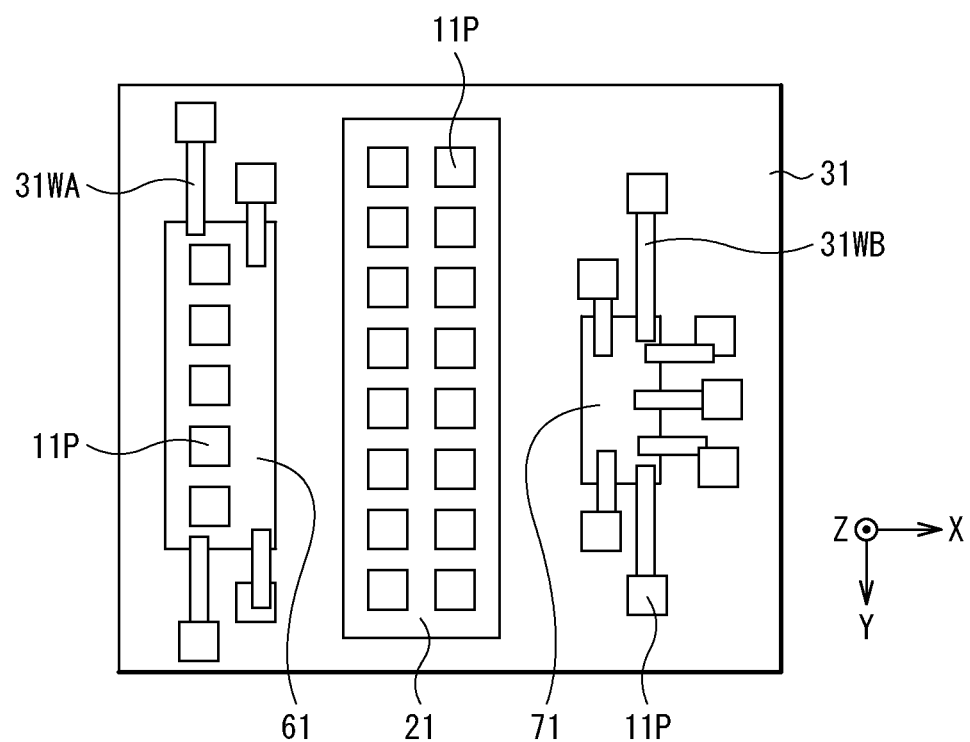
FIG. 24 is a schematic diagram illustrating an example of a planar configuration on a back surface side of a support substrate illustrated in FIG. 23.

FIG. 24 schematically illustrates a planar configuration on the back surface S31B side of the support substrate 31. The back surface S31B of the support substrate 31 is provided with the plurality of pad electrodes 11P.

The logic chip 21 and the pad electrode 11P are coupled by a wiring line 31W provided to the support substrate 31 (FIG. 23). This pad electrode 11P coupled to the logic chip 21 is disposed, for example, at a position overlapping with the logic chip 21 in a plan view (FIG. 24).

The first memory chip 61 and the pad electrode 11P are coupled by a wiring line 31WA provided to the support substrate 31. A portion of these pad electrodes 11P coupled to the first memory chip 61 is disposed, for example, at a position overlapping with the first memory chip 61 in a plan view. Some of the pad electrodes 11P coupled to the first memory chip 61 are also provided, for example, at positions that do not overlap with the first memory chip 61.

The second memory chip 71 and the pad electrode 11P are coupled by a wiring line 31WB provided to the support substrate 31. This pad electrodes 11P coupled to the second memory chip 71 is disposed, for example, at a position that does not overlap with the second memory chip 71 in a plan view.

In the present modification example, the logic chip 21, the first memory chip 61, and the second memory chip 71 are also disposed in the excavated portions 31E, 31EA, and 31EB of the support substrate 31. It is thus possible to form a planarized surface in the wiring layer 22 on the front surface S31A side of the support substrate 31. The sensor chip 11 is coupled to the logic chip 21 with this planarized surface (junction surface S) therebetween. This makes it possible to more simplify the electrical coupling between the sensor chip 11 and the logic chip 21 disposed in the stacking direction. In addition, the pad electrode 11P provided to the back surface S31B of the support substrate 31 makes it possible to achieve CSP.

Figure 25:
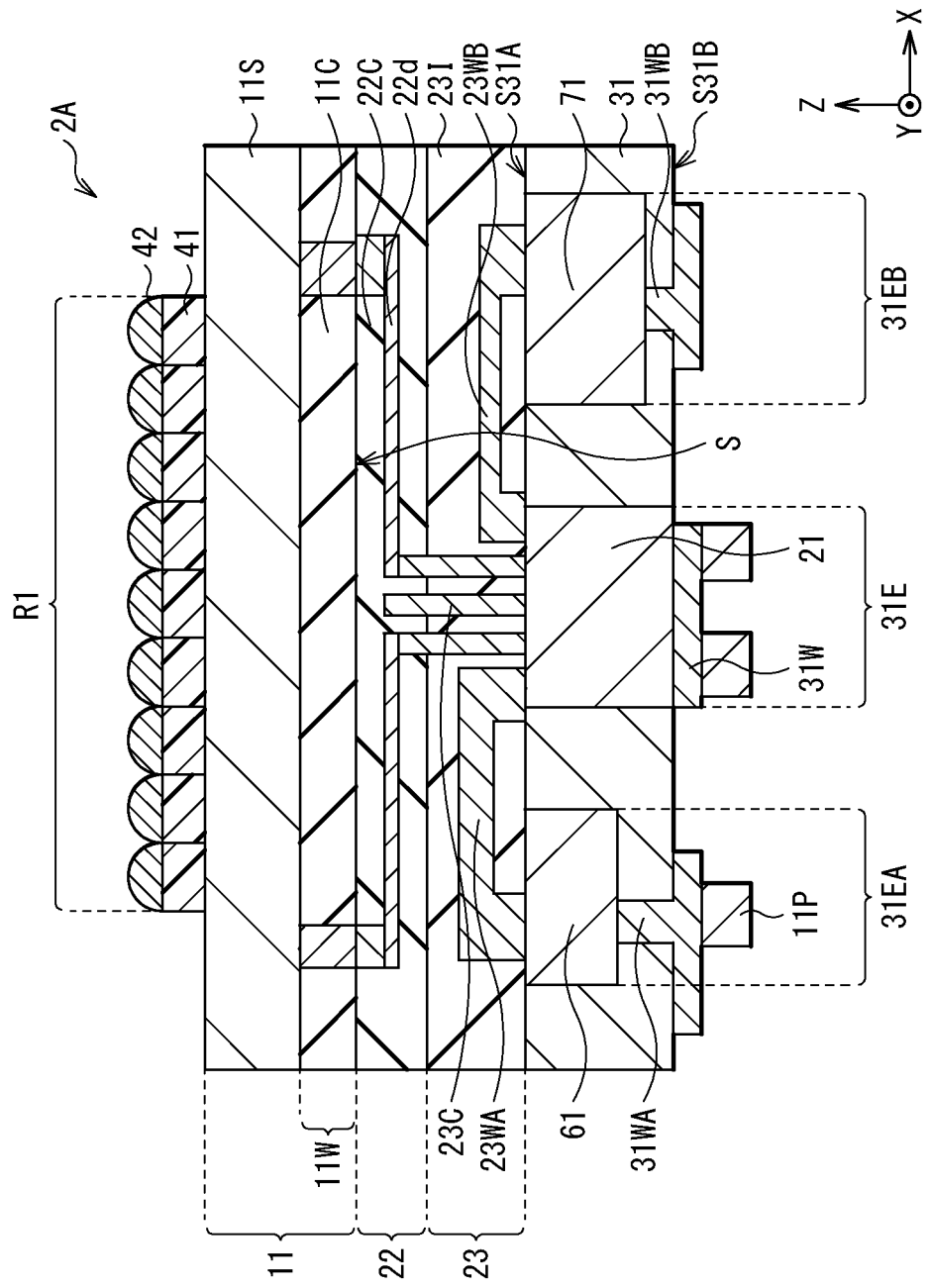
FIG. 25 is a cross-sectional schematic diagram illustrating another example of a configuration of the imaging device illustrated in FIG. 23.

FIG. 25 illustrates another example of the configuration of the imaging device 2A. In this way, the excavated portion 31E may be provided to have the shape of a hole.

Third Embodiment

Each of FIGS. 26 and 27 is an exploded perspective view of the main unit of an imaging device (imaging device 3) according to a third embodiment of the present disclosure. FIGS. 26 and 27 each illustrate the configuration of the support substrate 31 and the configurations of the logic chip 21 and the first memory chip 61 that are disposed in the excavated portions 31E and 31EA of the support substrate 31. In this imaging device 3, the respective excavated portions 31E and 31EA of the support substrate 31 are provided with position determiners (projecting portions G and GA described below) for fixing the positions of the logic chip 21 and the first memory chip 61. Except for this point, the imaging device 3 according to the third embodiment has a configuration similar to that of the imaging device 1 according to the above-described first embodiment and also attains similar workings and effects.

Although FIGS. 26 and 27 do not illustrate the excavated portion 31EB of the support substrate 31 or the second memory chip 71 (see FIG. 14), the imaging device 3 may be provided with the excavated portion 31EB and the second memory chip 71.

The excavated portions 31E and 31EA of the support substrate 31 are provided with sections (projecting portions G and GA) projecting from the edges of the excavated portions 31E and 31EA to the inside of the excavated portions 31E and 31EA. The excavated portion 31E is provided with the projecting portion G and the excavated portion 31EA is provided with the projecting portion GA.

FIG. 28 illustrates the configuration of the support substrate 31 provided with the projecting portions G and GA like these. (A) of FIG. 28 illustrates a planar configuration of the support substrate 31 and (B-1) and (B-2) of FIG. 28 each illustrate a cross-sectional configuration taken along the B-B' line in (A) of FIG. 28. (B-1) of FIG. 28 corresponds to the cross-sectional configuration of the support substrate 31 illustrated in FIGS. 26 and (B-2) of FIG. 26 corresponds to the cross-sectional configuration of the support substrate 31 illustrated in FIG. 27.

The projecting portions G and GA each have, for example, a quadrangular planar shape. The front surfaces of the projecting portions G and GA may be provided on substantially the same plane as the front surface S31A of the support substrate 31 outside the excavated portions 31E and 31EA ((B-1) of FIG. 28) and provided at positions closer to the back surface S31B of the support substrate 31 than the front surface S31A ((B-2) of FIG. 28).

There is provided a cut-out portion K at an edge of the logic chip 21 disposed in the excavated portion 31E. This cut-out portion K of the logic chip 21 fits into the projecting portion G of the excavated portion 31E, thereby positioning the logic chip 21 and the excavated portion 31E.

There is provided a cut-out portion KA at an edge of the first memory chip 61 disposed in the excavated portion 31EA. This cut-out portion KA of the first memory chip 61 fits into the projecting portion GA of the excavated portion 31EA, thereby positioning the first memory chip 61 and the excavated portion 31EA. The cut-out portions K and KA are provided to the entire logic chip 21 and first memory chip 61 in the thickness direction (FIG. 26) or portions of the back surface sides (FIG. 27) to fit into the projecting portions G and GA. The cut-out portions K and KA provided to portions of the logic chip 21 and the first memory chip 61 from the back surface sides in the thickness direction make it possible to increase regions on the front surfaces of the logic chip 21 and the first memory chip 61 in which it is possible to form circuits.

It is possible to form the projecting portions G and GA illustrated in FIG. 26 ((B-1) of FIG. 28), for example, as follows (FIGS. 29 and 30).

First, as illustrated in FIG. 29, the front surface S31A of the support substrate 31 is coated with a resist R. The resist R includes, for example, a photosensitive resin material. Next, as illustrated in FIG. 30, the regions of the excavated portions 31E and 31E except for the projecting portions G and GA are exposed. Afterward, an etching process is performed to form the excavated portions 31E and 31EA including the projecting portions G and GA.

FIGS. 31 to 34 illustrate steps of manufacturing the logic chip 21 including the cut-out portion K illustrated in FIG. 26 in order.

First, as illustrated in FIG. 31, a wafer is prepared that is provided with the plurality of logic chips 21 and this is decreased in thickness. Next, the surface opposite to the surface on which a circuit is formed is bonded to a temporary support substrate 81 as illustrated in FIG. 32. Subsequently, a resist pattern is formed and etching and resist stripping are performed with the temporary support substrate 81 bonded as illustrated in FIG. 33 to form the cut-out portion K on each logic chip 21. Afterward, the temporary support substrate 81 is removed from the wafer provided with the plurality of logic chips 21. The temporary support substrate 81 may be removed by stripping or the temporary support substrate 81 may be scraped. Finally, as illustrated in FIG. 34, the wafer provided with the plurality of logic chips 21 is subjected to a dicing process to be singulated. This forms the logic chips 21 each including the cut-out portion K. It is also possible to form the first memory chips 61 each including the cut-out portion KA in a similar method.

It is possible to form the projecting portions G and GA illustrated in FIG. 27 ((B-2) of FIG. 28), for example, as follows (FIGS. 35 and 36).

First, the front surface S31A of the support substrate 31 is coated with the resist R (FIG. 29). Next, as illustrated in FIG. 35, the regions of the excavated portions 31E and 31E except for the projecting portions G and GA are exposed and subjected to an etching process. Next, as illustrated in FIG. 36, the front surface S31A of the support substrate 31 is coated with the resist R again to expose the regions in which the projecting portions G and GA are formed. Afterward, an etching process is performed to allow the positions of the front surfaces of the projecting portions G and GA to be different from the position of the front surface S31A outside the excavated portions 31E and 31EA.

FIG. 37 illustrates one of the steps of manufacturing the logic chip 21 including the cut-out portion K illustrated in FIG. 27.

First, a wafer is prepared that is provided with the plurality of logic chips 21 and this is decreased in thickness (FIG. 31). Next, this wafer is inverted and the surface on which a circuit is formed is bonded to the temporary support substrate 81 as illustrated in FIG. 37. Subsequently, a resist pattern is formed and etching and resist stripping are performed with the temporary support substrate 81 bonded to form the cut-out portion K on a portion of the back surface side of each logic chip 21. Afterward, the temporary support substrate 81 is removed from the wafer provided with the plurality of logic chips 21. The temporary support substrate 81 may be removed by stripping or the temporary support substrate 81 may be scraped. Finally, the wafer provided with the plurality of logic chips 21 is subjected to a dicing process to be singulated.

The imaging device 3 according to the present embodiment also has the logic chip 21 and the first memory chip 61 disposed in the excavated portions 31E and 31EA of the support substrate 31. It is thus possible to form a planarized surface in the wiring layer 22 on the front surface S31A side of the support substrate 31. The sensor chip 11 is coupled to the logic chip 21 with this planarized surface (junction surface S) therebetween. This makes it possible to more simplify the electrical coupling between the sensor chip 11 and the logic chip 21 disposed in the stacking direction.

In addition, the excavated portions 31E and 31EA of the support substrate 31 are provided with the projecting portions G and GA. It is thus possible to increase the accuracy of positioning the excavated portions 31E and 31EA, the logic chips 21, and the first memory chips 61. This increases the positioning accuracy of the junction surfaces S. It is therefore possible to narrow the disposition intervals between the contact electrodes 11C and 22C. This makes it possible to provide the more contact electrodes 11C and 22C.

Modification Example 5

FIGS. 38 to 41 each illustrate another example of the configuration of the support substrate 31 including the projecting portions G, GA, and GB. For example, the excavated portion 31EB of the support substrate 31 may be provided with the projecting portion (projecting portion GB).

The plurality of projecting portions G, GA, and GB may be respectively provided to the excavated portions 31E, 31EA, and 31EB (FIG. 38). For example, the excavated portion 31E is provided with the two projecting portions G, the excavated portion 31EA is provided with the two projecting portions GA, and the excavated portion 31EB is provided with the two projecting portions GB.

The projecting portions G, GA, and GB may each have a planar shape other than a quadrangle. For example, the projecting portions G, GA, and GB may each have a semicircle (FIG. 39), a triangle (FIG. 40), or the like. Alternatively, the projecting portions G, GA, and GB may each have a planar shape such as a circle or a polygon having five angles or more.

The three or more projecting portions G, GA, and GB may be respectively provided to the excavated portions 31E, 31EA, and 31EB. For example, the four projecting portions G, GA, and GB may be provided (FIG. 41).

Modification Example 6

As illustrated in FIG. 42, the support substrate 31 may include a position determiner other than a projecting portion. For example, protruding portions (protruding portions T, TA, and TB) provided in the excavated portions 31E, 31EA, and 31EB may be included as position determiners. These protruding portions T, TA, and TB each have height, for example, less than the thickness of the support substrate 31. The shape of each of the protruding portions T, TA, and TB is, for example, a cylinder. The protruding portions T, TA, and TB may each have a shape other than a cylinder. For example, protruding portions T, TA, and TB may each have a shape such as a hemisphere, a cone, a pyramid, and a rectangular column.

Applied Examples

The above-described imaging devices 1, 1A, 1B, 1C, 2, 2A, and 3 (shortened as the imaging device 1 below) are applicable, for example, to various types of electronic apparatuses such as cameras. FIG. 43 illustrates a schematic configuration of an electronic apparatus 4 (camera) as an example thereof. This electronic apparatus 4 is, for example, a camera that is able to shoot a still image or a moving image. The electronic apparatus 4 includes the imaging device 1, an optical system (optical lens) 310, a shutter device 311, a driver 313 that drives the imaging device 1 and the shutter device 311, and a signal processor 312.

The optical system 310 guides image light (incident light) from a subject to the imaging device 1. This optical system 310 may include a plurality of optical lenses. The shutter device 311 controls a period in which the imaging device 1 is irradiated with light and a period in which light is blocked. The driver 313 controls a transfer operation of the imaging device 1 and a shutter operation of the shutter device 311. The signal processor 312 performs various kinds of signal processing on a signal outputted from the imaging device 1. An image signal Dout subjected to the signal processing is stored in a storage medium such as a memory or outputted to a monitor or the like.

<Example of Application to In-Vivo Information Acquisition System>

Further, the technology (the present technology) according to the present disclosure is applicable to a variety of products. For example, the technology according to the present disclosure may be applied to an endoscopic surgery system.

FIG. 44 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 44, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The above has described the example of the in-vivo information acquisition system to which the technology according to the present disclosure may be applied. The technology according to the present disclosure may be applied, for example, to the image pickup unit 10112 among the above-described components. This increases the detection accuracy.

<Example of Application to Endoscopic Surgery System>

The technology (the present technology) according to the present disclosure is applicable to a variety of products. For example, the technology according to the present disclosure may be applied to an endoscopic surgery system.

FIG. 45 is a view depicting an example of a schematic configuration of an endoscopic surgery system to which the technology according to an embodiment of the present disclosure (present technology) can be applied.

In FIG. 45, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 46 is a block diagram depicting an example of a functional configuration of the camera head 11102 and the CCU 11201 depicted in FIG. 45.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be applied to the image pickup unit 11402 among the above-described components. Applying the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

<Example of Application to Mobile Body>

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 47 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 47, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 47, an audio speaker 12061, a display section 12062, and an instrument panel 12063 are illustrated as the output device. The display section 12062 may, for example, include at least one of an on-board display and a head-up display.

FIG. 48 is a diagram depicting an example of the installation position of the imaging section 12031.

In FIG. 48, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 48 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the above-described components. Applying the technology according to the present disclosure to the imaging section 12031 makes it possible to obtain a shot image that is easier to see. This makes it possible to decrease the fatigue of a driver.

The above has described the present disclosure with reference to the embodiments and the modification examples, but the contents of the present disclosure are not limited to the above-described embodiments. The present disclosure may be modified in a variety of ways. For example, the configuration of the imaging device described in the above-described embodiments or the like is an example, and other layers may be further included. In addition, the material and thickness of each layer are also merely examples. Those described above are not limitative.

In addition, in the above-described embodiments or the like, the example has been described in which the support substrate 31 is provided with the sensor chip 11, the logic chip 21, the first memory chip 61, or the second memory chip 71, but the support substrate 31 may be provided with a chip having another function.

In addition, a chip disposed on the support substrate 31 may include a semiconductor material other than silicon (Si). For example, a compound semiconductor material, an organic semiconductor material, or the like may be included. Alternatively, MEMS (Micro Electro Mechanical System) or the like may be disposed on the support substrate 31.

In addition, in the above-described second embodiment, the case has been described where the support substrate 31 is provided with three excavated portions (excavated portions 31E, 31EA, and 31EB) (FIG. 14 or the like), but the support substrate 31 may be provided with two excavated portions (FIG. 26) or four or more excavated portions.

In addition, in the above-described second embodiment, the case has been described where the support substrate 31 is provided with the logic chip 21, the first memory chip 61, and the second memory chip 71 (FIG. 14 or the like), but the support substrate 31 may be provided with a chip having any function. For example, the support substrate 31 may be provided with two or more logic chips.

In addition, in the above-described third embodiment, the case has been described where the excavated portion 31E is provided with the projecting portion G that extends from an edge to the inside of the excavated portion 31E (FIG. 28 or the like), but a position determiner may be obtained by partially expanding the excavated portion 31E.

In addition, in the above-described embodiments or the like, the case has been described where the technology according to the present disclosure is applied to an imaging device, but the technology according to the present disclosure is applicable to a general semiconductor device other than an imaging device.

The effects described in the above-described embodiments or the like are examples. The effects may be other effects or may further include other effects.

It is to be noted that the present disclosure may have the following configurations.

(1)
An imaging device including:
a first chip;
a support substrate including an excavated portion in a region opposed to the first chip, the excavated portion having a shape of a recess or a shape of a hole; and
a second chip that is disposed in the excavated portion of the support substrate, the second chip being electrically coupled to the first chip, in which
at least one of the first chip or the second chip has a photoelectric conversion function.

(2)
The imaging device according to (1), in which the first chip has a region opposed to the second chip and a region opposed to the support substrate outside the excavated portion.

(3)
The imaging device according to (1) or (2), in which depth of the excavated portion is same as thickness of the second chip or greater than the thickness of the second chip.

(4)
The imaging device according to (1) or (2), in which
the excavated portion of the support substrate has the shape of the hole, and
a back surface of the second chip is provided on a same plane as a back surface of the support substrate outside the excavated portion.

(5)
The imaging device according to any one of (1) to (4), further including a first wiring layer that is provided between the support substrate and the first chip, the first wiring layer including a wiring line for coupling the second chip to the first chip.

(6)
The imaging device according to (5), in which
the first wiring layer further includes an external coupling terminal, and
the support substrate has a through hole at a position opposed to the external coupling terminal.

(7)
The imaging device according to any one of (1) to (6), in which
the support substrate includes a plurality of the excavated portions, and
the second chip is disposed in each of the plurality of excavated portions.

(8)
The imaging device according to (7), in which at least portions of a plurality of the excavated portions are different from each other in at least one of area or depth.

(9)
The imaging device according to (7) or (8), further including a second wiring layer that is provided between the support substrate and the first chip, the second wiring layer including a wiring line for coupling a plurality of the second chips to each other.

(10)
The imaging device according to any one of (1) to (9), in which the support substrate includes a position determiner at the excavated portion, the position determiner fixing a position of the second chip.

(11)
The imaging device according to (10), in which
the position determiner includes a projecting portion that extends from an edge of the excavated portion to inside of the excavated portion, and
the second chip includes a cut-out portion that fits into the projecting portion.

(12)
The imaging device according to (11), in which a front surface of the projecting portion is provided on a same plane as a front surface of the support substrate outside the excavated portion.

(13)
The imaging device according to (11), in which a front surface of the projecting portion is provided at a position closer to a back surface of the support substrate than a front surface of the support substrate outside the excavated portion.

(14)
The imaging device according to any one of (10) to (13), in which the support substrate includes a plurality of the position determiners at the excavated portion.

(15)
The imaging device according to any one of (1) to (14), in which the second chip is electrically coupled to the first chip by CuCu junction.

(16)
The imaging device according to any one of (1) to (15), in which the support substrate includes a silicon (Si) substrate.

(17)
The imaging device according to any one of (1) to (16), in which the second chip includes silicon.

(18)
The imaging device according to any one of (1) to (17), further including a third chip that is provided between the support substrate and the first chip, the third chip being electrically coupled to the first chip.

(19)
The imaging device according to any one of (1) to (18), in which the first chip has the photoelectric conversion function.

(20)

The imaging device according to any one of (1) to (18), in which the second chip has the photoelectric conversion function.

This application claims the priority on the basis of Japanese Patent Application No. 2018-101579 filed on May 28, 2018 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging device, comprising:
    a first chip;
    a support substrate including a front surface defining an excavated portion in a region opposed to the first chip and a back surface opposite to the front surface and further opposed to the first chip, the excavated portion having a shape of a recess or a shape of a hole;
    a second chip that is disposed in the excavated portion of the support substrate between the first chip and the back surface of the support substrate in a cross-sectional view, the second chip being electrically coupled to the first chip; and
    an insulating film,
    wherein at least one of the first chip or the second chip has a photoelectric conversion function,
    wherein at least a part of the insulating film is disposed between the second chip and the support substrate in the excavated portion of the support substrate, and
    wherein a portion of the insulating film provided above the excavation portion is disposed between the second chip and the first chip and in contact with the first chip in the cross-sectional view.

2. The imaging device according to claim 1, wherein the first chip has a region opposed to the second chip and a region opposed to the support substrate outside the excavated portion.

3. The imaging device according to claim 1, wherein a depth of the excavated portion has a same thickness as the second chip or a greater thickness than the second chip.

4. The imaging device according to claim 1, wherein
    the excavated portion of the support substrate has the shape of the hole, and
    a back surface of the second chip is provided on a same plane as the front surface of the support substrate.

5. The imaging device according to claim 1, further comprising a first wiring layer that is provided between the support substrate and the first chip, the first wiring layer including a wiring line for coupling the second chip to the first chip.

6. The imaging device according to claim 5, wherein
    the first wiring layer further includes an external coupling terminal, and
    the support substrate has a through hole at a position opposed to the external coupling terminal.

7. The imaging device according to claim 1, wherein
    the support substrate includes a plurality of the excavated portions, and
    the second chip is disposed in each of the plurality of excavated portions.

8. The imaging device according to claim 7, wherein at least portions of a plurality of the excavated portions are different from each other in at least one of area or depth.

9. The imaging device according to claim 7, further comprising a second wiring layer that is provided between the support substrate and the first chip, the second wiring layer including a wiring line for coupling a plurality of the second chips to each other.

10. The imaging device according to claim 1, wherein the support substrate includes a position determiner at the excavated portion, the position determiner fixing a position of the second chip.

11. The imaging device according to claim 10, wherein
    the position determiner includes a projecting portion that extends from an edge of the excavated portion to inside of the excavated portion, and
    the second chip includes a cut-out portion that fits into the projecting portion.

12. The imaging device according to claim 11, wherein a front surface of the projecting portion is provided on a same plane as the front surface of the support substrate outside the excavated portion.

13. The imaging device according to claim 11, wherein a front surface of the projecting portion is provided at a position closer to the back surface of the support substrate than the front surface of the support substrate outside the excavated portion.

14. The imaging device according to claim 10, wherein the support substrate includes a plurality of the position determiners at the excavated portion.

15. The imaging device according to claim 1, wherein the second chip is electrically coupled to the first chip by CuCu junction.

16. The imaging device according to claim 1, wherein the support substrate includes a silicon (Si) substrate.

17. The imaging device according to claim 1, wherein the second chip includes silicon.

18. The imaging device according to claim 1, further comprising a third chip that is provided between the support substrate and the first chip, the third chip being electrically coupled to the first chip.

19. The imaging device according to claim 1, wherein the first chip has the photoelectric conversion function.

20. The imaging device according to claim 1, wherein the second chip has the photoelectric conversion function.

* * * * *